United States Patent
Sakai et al.

(10) Patent No.: US 10,156,714 B1
(45) Date of Patent: Dec. 18, 2018

(54) ELECTROWETTING PIXEL WITH BOTTOM ELECTRODE TO REDUCE ELECTROMAGNETIC FRINGE FIELDS

(71) Applicant: Amazon Technologies, Inc., Seattle, WA (US)

(72) Inventors: Toru Sakai, Waalre (NL); Abhishek Kumar, Tilburg (NL)

(73) Assignee: AMAZON TECHNOLOGIES, INC., Seattle, WA (US)

( * ) Notice: Subject to any disclaimer, the term of this patent is extended or adjusted under 35 U.S.C. 154(b) by 142 days.

(21) Appl. No.: 15/466,765

(22) Filed: Mar. 22, 2017

(51) Int. Cl.
*G02B 26/00* (2006.01)
*H01L 27/12* (2006.01)

(52) U.S. Cl.
CPC .......... *G02B 26/005* (2013.01); *H01L 27/124* (2013.01); *H01L 27/1248* (2013.01)

(58) Field of Classification Search
CPC .. G02B 26/005; H01L 27/124; H01L 27/1248
USPC ........ 359/237–240, 242, 245–246, 250–252, 359/265–271, 290–298; 349/38–40
See application file for complete search history.

(56) References Cited

U.S. PATENT DOCUMENTS

| | | | | |
|---|---|---|---|---|
| 6,246,459 B1* | 6/2001 | Simhambhatla | .. | G02F 1/133308 349/149 |
| 7,495,821 B2* | 2/2009 | Yamakita | ................ | G02F 1/167 359/290 |
| 7,852,547 B2* | 12/2010 | Kim | ...................... | G02B 26/005 345/107 |
| 8,279,166 B2* | 10/2012 | Huitema | ................ | G09G 3/348 345/107 |
| 8,508,468 B2* | 8/2013 | Huitema | .............. | G02B 26/004 345/107 |
| 8,730,225 B2* | 5/2014 | Bae | ...................... | G02B 26/005 345/211 |
| 8,810,883 B2* | 8/2014 | Lee | ......................... | G02B 5/201 359/228 |
| 8,844,128 B2* | 9/2014 | Lim | ........................ | G02F 1/167 29/592.1 |
| 9,279,926 B2* | 3/2016 | Saito | ........................ | G02B 5/26 |
| 10,001,640 B1* | 6/2018 | Kumar | ................. | G02B 26/005 |
| 10,078,212 B1* | 9/2018 | Sakai | ................... | G02B 26/005 |
| 2009/0058840 A1* | 3/2009 | Lee | ...................... | G02B 26/005 345/204 |

(Continued)

*Primary Examiner* — William R Alexander
*Assistant Examiner* — Tamara Y Washington
(74) *Attorney, Agent, or Firm* — Quarles and Brady LLP

(57) ABSTRACT

A device includes first and second support plates. A plurality of pixel walls are formed over the first support plate. The plurality of pixel walls are associated with an electrowetting pixel and define a volume. The electrowetting pixel includes a fluid accumulation region defined by a recess in a hydrophobic layer of the electrowetting pixel. A transistor is over the first support plate underneath a first pixel wall in the plurality of pixel walls and a pixel electrode is formed over the first support plate underneath the volume defined by the plurality of pixel walls in electrical contact with the transistor. A bottom electrode is formed over the first support plate underneath the volume defined by the plurality of pixel walls. A first portion of the bottom electrode is located underneath the fluid accumulation region and a second portion of the bottom electrode is located underneath the pixel electrode.

20 Claims, 8 Drawing Sheets

(56) References Cited

U.S. PATENT DOCUMENTS

| | | | | |
|---|---|---|---|---|
| 2011/0227080 A1* | 9/2011 | Roh | G02B 26/005 | 257/59 |
| 2012/0262774 A1* | 10/2012 | Bae | G02B 26/005 | 359/290 |
| 2012/0287364 A1* | 11/2012 | Peng | H01L 29/4908 | 349/43 |
| 2013/0208337 A1* | 8/2013 | Lee | G02B 26/005 | 359/290 |
| 2013/0215491 A1* | 8/2013 | Choi | G02B 26/005 | 359/290 |
| 2013/0242367 A1* | 9/2013 | Cho | G02B 26/005 | 359/228 |
| 2013/0242371 A1* | 9/2013 | Kodaira | G02F 1/167 | 359/290 |
| 2013/0250396 A1* | 9/2013 | Kim | G02B 26/005 | 359/290 |
| 2013/0258443 A1* | 10/2013 | Jung | G02B 26/005 | 359/290 |
| 2013/0271817 A1* | 10/2013 | Jung | G02B 26/005 | 359/290 |
| 2013/0301106 A1* | 11/2013 | Jon | G02B 26/005 | 359/290 |
| 2013/0301108 A1* | 11/2013 | Lim | G02B 26/005 | 359/290 |
| 2013/0329274 A1* | 12/2013 | Yang | G02B 26/005 | 359/290 |
| 2013/0335804 A1* | 12/2013 | Sung | G02B 26/005 | 359/290 |
| 2014/0022622 A1* | 1/2014 | Park | G02B 26/005 | 359/290 |
| 2014/0029080 A1* | 1/2014 | Hwang | G02B 26/005 | 359/290 |
| 2014/0036341 A1* | 2/2014 | Kwon | G02B 26/005 | 359/290 |
| 2014/0043671 A1* | 2/2014 | Kodaira | G02B 26/005 | 359/290 |
| 2014/0063586 A1* | 3/2014 | Jung | G02B 26/005 | 359/290 |
| 2015/0277100 A1* | 10/2015 | Novoselov | G02B 26/005 | 359/290 |
| 2016/0254336 A1* | 9/2016 | Zhang | G02F 1/134309 | 349/33 |

* cited by examiner

ELECTROWETTING PIXEL WITH BOTTOM ELECTRODE TO REDUCE ELECTROMAGNETIC FRINGE FIELDS

BACKGROUND

Electronic displays are found in numerous types of electronic devices including, without limitation, electronic book ("eBook") readers, mobile phones, laptop computers, desktop computers, televisions, appliances, automotive electronics, and augmented reality devices. Electronic displays may present various types of information, such as user interfaces, device operational status, digital content items, and the like, depending on the kind and purpose of the associated device. The appearance and quality of a display may affect a user's experience with the electronic device and the content presented thereon. Accordingly, enhancing user experience and satisfaction continues to be a priority. Moreover, increased multimedia use imposes high demands on designing, packaging, and fabricating display devices, as content available for mobile use becomes more extensive and device portability continues to be a high priority to the consumer.

An electrowetting display includes an array of pixels individually bordered by pixel walls that retain fluid, such as an opaque oil, for example. Light transmission through each pixel is adjustable by electronically controlling a position of the fluid in the pixel.

BRIEF DESCRIPTION OF THE DRAWINGS

The detailed description is set forth with reference to the accompanying figures. The use of the same reference numbers in different figures indicates similar or identical items or features.

DETAILED DESCRIPTION

Figure 1A:
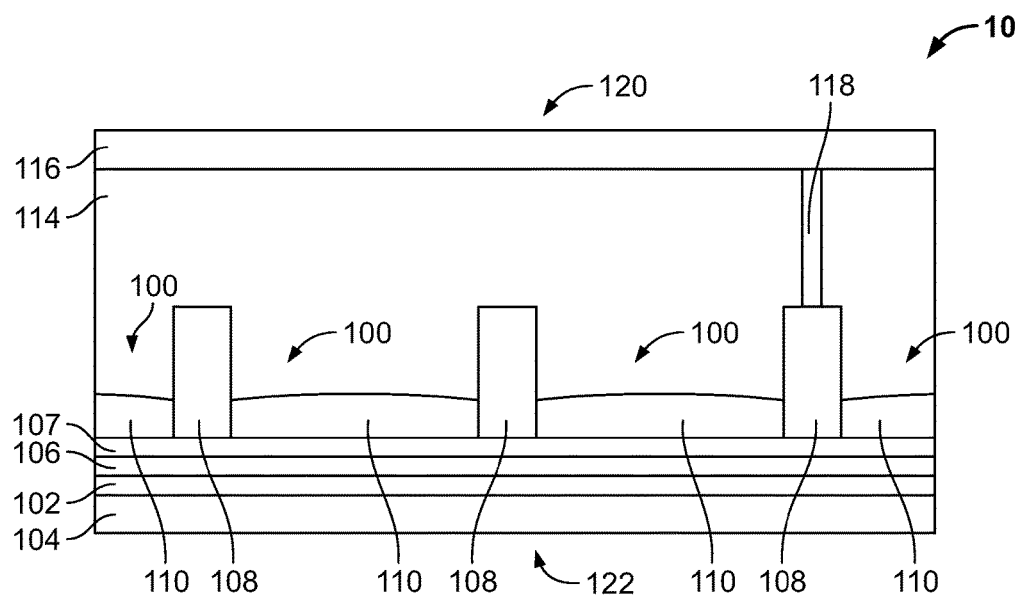
FIGS. 1A and 1B illustrate cross sectional views of a portion of an example electrowetting display device.

In various embodiments described herein, electronic devices include electrowetting displays for presenting content and other information. In some examples, the electronic devices may include one or more components associated with the electrowetting display, such as a touch sensor component layered atop the electrowetting display for detecting touch inputs, a front light or back light component for lighting the electrowetting display, and a cover layer component, which may include antiglare properties, antireflective properties, anti-fingerprint properties, anti-cracking properties, and the like.

An electrowetting display includes a number of electrowetting pixels fabricated over a first or bottom support plate. Each electrowetting pixel is associated with a number of pixel walls. The pixel walls are configured to define a volume containing at least a portion of a first fluid, such as a black opaque oil. Light transmission through the electrowetting pixels can be controlled by an application of an electric potential or driving voltage to the electrowetting pixels, which results in a movement of a second fluid, such as an electrolyte solution, into or within the electrowetting pixels, thereby displacing the oil.

When an electrowetting pixel is in a rest state (i.e., with no driving voltage applied or at a driving voltage that falls below a threshold value causing the electrowetting pixel to be inactive), the oil is distributed throughout the pixel. The oil absorbs light and the pixel in this condition appears black. But when the driving voltage is applied, the oil is displaced to a side of the pixel. Light can then enter the electrowetting pixel causing the pixel to appear less dark (e.g., white) to an observer. If the electrowetting display is a reflective display, the bottom of each electrowetting pixel includes a reflective surface. In such a display, light will enter the open pixel, strike the reflective surface at the bottom of the pixel and be reflected out of the pixel. If, however, the electrowetting display is a transmissive display, the bottoms of the pixels are transparent and light entering the open pixels passes through the open pixel and the bottom support plate over which the pixels are formed. If a color filter is incorporated over or into the pixel, the pixel may appear to have color.

The degree to which the oil is displaced from the oil's resting position affects the pixel's perceived brightness. By manipulating the driving voltage applied to the electronic device's electrowetting pixels, different images can be depicted on a display surface of the electronic device.

To enable accurate image formation in the electrowetting display device, it is generally desirable that the oil and electrolyte fluids move in a predictable manner. Specifically, when a driving voltage is applied to a closed electrowetting pixel, the oil should preferably move or be displaced in a predictable direction within the electrowetting pixel. Generally, an electrowetting pixel's driving voltage is applied to a pixel electrode formed over or within the bottom surface of the pixel.

The application of the driving voltage to an electrowetting pixel's pixel electrode is controlled by a transistor that is generally located underneath one of the walls of the electrowetting pixel. When a gate voltage is applied to the transistor, the transistor becomes conductive and the pixel's electrode can be set to a driving voltage, which causes oil movement within the pixel.

To maintain the driving voltage on the pixel electrode for a period of time, the pixel electrode operates in conjunction with a bottom electrode located underneath the pixel electrode in the bottom support plate. Together, the pixel electrode and bottom electrode form a capacitive structure. That capacitive structure enables the pixel electrode to remain at the desired driving voltage even when the transistor is non-conductive.

Generally, when the electrowetting pixel's pixel electrode is set to a driving voltage, the pixel's oil will move in a direction away from the electrowetting pixel's transistor towards the opposing pixel wall. The oil, once displaced, accumulates in a region of the electrowetting pixel against the far pixel wall referred to as the oil or fluid accumulation region.

In a conventional electrowetting pixel, the fluid accumulation region is a slightly recessed portion in the bottom surface of the electrowetting pixel formed in proximity to the pixel wall opposite the pixel wall that is located over the pixel's controlling transistor. The fluid accumulation region is fabricated so as to not incorporate electrical components or conductive structures.

It is generally desirable that the displaced oil accumulate within the fluid accumulation region in contact with or in close proximity to the nearby pixel wall. In practice, however, that pixel wall is itself located over a second transistor that controls the application of a driving voltage to the neighboring electrowetting pixel.

When a driving voltage is applied to that neighboring pixel, source and gate voltages may be applied to the second transistor. Those voltages can generate fringe electric fields that themselves interfere with oil movement in the first pixel. In some cases, the fringe electric fields generated by the second neighboring transistor can promote oil movement away from pixel wall nearby the fluid accumulation region in the opposite direction than desired when a driving voltage is applied to the first electrowetting pixel.

To mitigate this problem, in the present electrowetting pixel configuration the pixel's bottom electrode is extended into the pixel's fluid accumulation region. Because the bottom electrode is maintained at a common voltage, the proximity of the bottom electrode to the neighboring pixel's transistor operates to reduce or mitigate the creation of fringe electric fields when the neighboring pixel's transistor is subjected to gate and source voltages. By reducing these fringe electric fields, their effect on oil movement within the first pixel is reduced, enabling more predictable control of oil movement within the first pixel.

A display device, such as an electrowetting display device, may be a transmissive, reflective or transflective display that generally includes an array of pixels, which comprise a number of sub-pixels, configured to be operated by an active matrix addressing scheme. For example, rows and columns of electrowetting pixels (and their sub-pixels) are operated by controlling voltage levels on a plurality of source lines and gate lines. In this fashion, the display device may produce an image by selecting particular pixels or sub-pixels to transmit, reflect or block light. Pixels are addressed (e.g., selected) via rows and columns of the source lines and the gate lines that are electrically connected to transistors (e.g., used as switches) included in each pixel. The transistors take up a relatively small fraction of the area of each pixel to allow light to efficiently pass through (or reflect from) the display pixel. Herein, a pixel may, unless otherwise specified, be made up of two or more sub-pixels of an electrowetting display device. Such a pixel or sub-pixel may be the smallest light transmissive, reflective or transflective pixel of a display that is individually operable to directly control an amount of light transmission through or reflection from the pixel. For example, in some embodiments, a pixel may comprise a red sub-pixel, a green sub-pixel, and a blue sub-pixel. In other embodiments, a pixel may be a smallest component, e.g., the pixel does not include any sub-pixels. Accordingly, embodiments of the present system may be equally applicable to controlling the state (e.g., reflectance value or driving voltage) of sub-pixels or pixels in various display devices.

Electrowetting displays include an array of pixels sandwiched between two support plates, such as a bottom support plate and a top support plate. For example, a bottom support plate in cooperation with a top support plate may contain pixels that include electrowetting oil, electrolyte solution and pixel walls between the support plates. Support plates may include glass, plastic (e.g., a transparent thermoplastic such as a poly(methyl methacrylate) (PMMA) or other acrylic), or other transparent material and may be made of a rigid material or a flexible material, for example. Pixels include various layers of materials built upon a bottom support plate. One example layer is an amorphous fluoropolymer (AF) with hydrophobic behavior, around portions of which pixel walls are built.

Hereinafter, example embodiments include, but are not limited to, reflective electrowetting displays that include a clear or transparent top support plate and a bottom support plate, which need not be transparent. The clear top support plate may comprise glass or any of a number of transparent materials, such as transparent plastic, quartz, and semiconductors, for example, and claimed subject matter is not limited in this respect. "Top" and "bottom" as used herein to identify the support plates of an electrowetting display do not necessarily refer to a direction referenced to gravity or to a viewing side of the electrowetting display. Also, as used herein for the sake of convenience of describing example embodiments, the top support plate is that through which viewing of pixels of a (reflective) electrowetting display occurs.

In some embodiments, a reflective electrowetting display comprises an array of pixels sandwiched between a bottom support plate and a top support plate. The bottom support plate may be opaque while the top support plate is transparent. Herein, describing a pixel, sub-pixel, or material as being "transparent" means that the pixel or material may transmit a relatively large fraction of the light incident upon it. For example, a transparent material or layer may transmit more than 70% or 80% of the light impinging on its surface, though claimed subject matter is not limited in this respect.

Pixel walls retain at least a first fluid which is electrically non-conductive, such as an opaque or colored oil, in the individual pixels. A cavity formed between the support plates is filled with the first fluid (e.g., retained by pixel walls) and a second fluid (e.g., considered to be an electrolyte solution) that is electrically conductive or polar and may be a water or a salt solution such as a solution of potassium chloride water. The second fluid may be transparent, but may be colored, or light-absorbing. The second fluid is immiscible with the first fluid.

Individual reflective electrowetting pixels may include a reflective layer on the bottom support plate of the electrowetting pixel, a transparent electrode layer adjacent to the reflective layer, and a hydrophobic layer on the electrode layer. Pixel walls of each pixel, the hydrophobic layer, and the transparent top support plate at least partially enclose a liquid region that includes an electrolyte solution and an opaque liquid, which is immiscible with the electrolyte solution. An "opaque" liquid, as described herein, is used to describe a liquid that appears black to an observer. For example, an opaque liquid strongly absorbs a broad spectrum of wavelengths (e.g., including those of red, green and blue light) in the visible region of electromagnetic radiation. In some embodiments, the opaque liquid is a nonpolar electrowetting oil.

The opaque liquid is disposed in the liquid region. A coverage area of the opaque liquid on the bottom hydrophobic layer is electrically adjustable to affect the amount of light incident on the reflective electrowetting display that reaches the reflective material at the bottom of each pixel.

In addition to pixels, spacers and edge seals may also be located between the two support plates. The support plates may comprise any of a number of materials, such as plastic, glass, quartz, and semiconducting materials, for example, and claimed subject matter is not limited in this respect.

Spacers and edge seals which mechanically connect the first support plate with the second overlying support plate, or which form a separation between the first support plate and the second support plate, contribute to mechanical integrity of the electrowetting display. Edge seals, for example, being disposed along a periphery of an array of electrowetting pixels, may contribute to retaining fluids (e.g., the first and second fluids) between the first support plate and the second overlying support plate. Spacers can be at least partially transparent so as to not hinder throughput of light in the electrowetting display. The transparency of spacers may at least partially depend on the refractive index of the spacer material, which can be similar to or the same as the refractive indices of surrounding media. Spacers may also be chemically inert to surrounding media.

In some embodiments, a display device as described herein may comprise a portion of a system that includes one or more processors and one or more computer memories, which may reside on a control board, for example. Display software may be stored on the one or more memories and may be operable with the one or more processors to modulate light that is received from an outside source (e.g., ambient room light) or out-coupled from a lightguide of the display device. For example, display software may include code executable by a processor to modulate optical properties of individual pixels of the electrowetting display based, at least in part, on electronic signals representative of image and/or video data. The code may cause the processor to modulate the optical properties of pixels by controlling electrical signals (e.g., voltages, currents, and fields) on, over, and/or in layers of the electrowetting display.

Figure 1B:
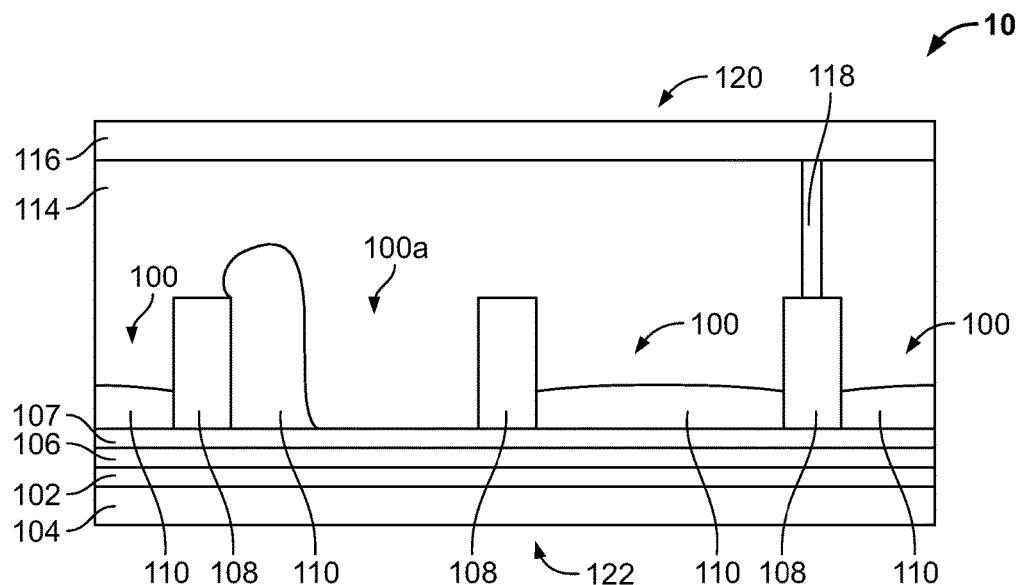
Figure 2:
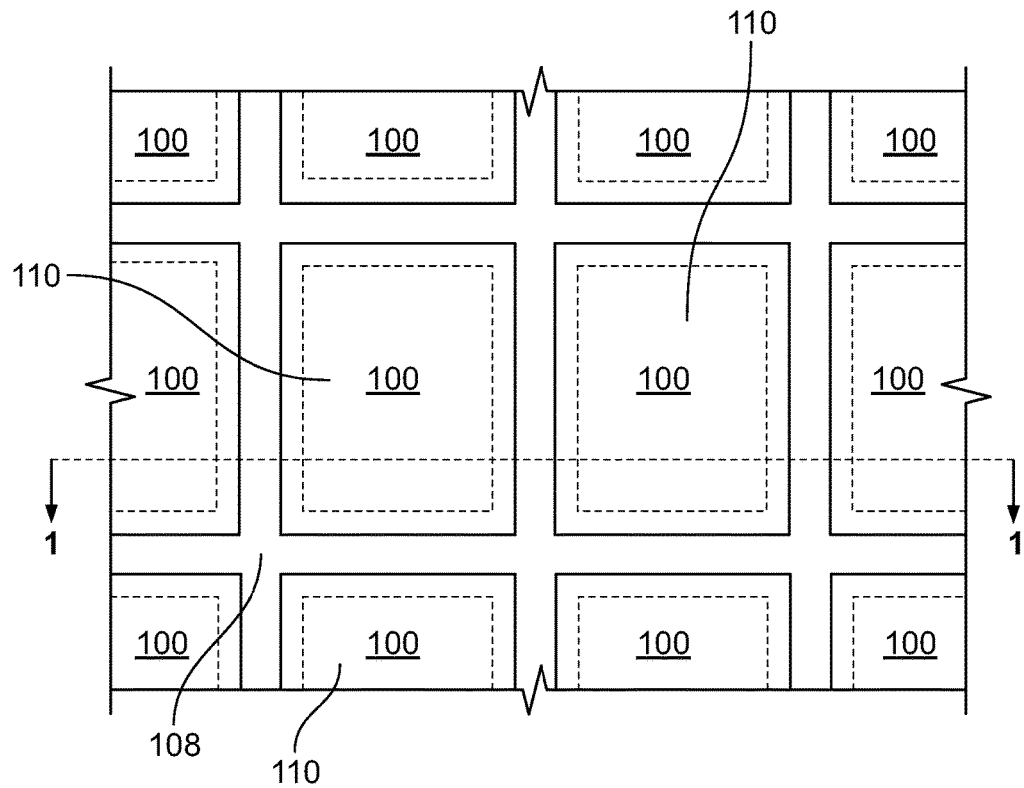
FIG. 2 illustrates a top view of the electrowetting pixels of FIGS. 1A and 1B.

FIG. 1A is a cross-section of a portion of an example reflective electrowetting display device 10 illustrating several electrowetting pixels 100 taken along sectional line 1-1 of FIG. 2. FIG. 1B shows the same cross-sectional view as FIG. 1A in which an electric potential has been applied to one of the electrowetting pixels 100 causing displacement of a first fluid disposed therein, as described below. FIG. 2 shows a top view of electrowetting pixels 100 formed over a bottom support plate 104.

In FIGS. 1A and 1B, two complete electrowetting pixels 100 and two partial electrowetting pixels 100 are illustrated. Electrowetting display device 10 may include any number (usually a very large number, such as thousands or millions) of electrowetting pixels 100. An electrode layer 102 is formed on a bottom support plate 104.

In various embodiments, electrode layer 102 may be connected to any number of transistors, such as thin film transistors (TFTs) (not shown), that are switched to either select or deselect electrowetting pixels 100 using active matrix addressing, for example. A TFT is a particular type of field-effect transistor that includes thin films of an active semiconductor layer as well as a dielectric layer and metallic contacts over a supporting (but non-conducting) substrate, which may be glass or any of a number of other suitable transparent or non-transparent materials, for example.

In some embodiments, a dielectric barrier layer 106 may at least partially separate electrode layer 102 from a hydrophobic layer 107, such as an amorphous fluoropolymer layer for example, also formed on bottom support plate 104. Such separation may, among other things, prevent electrolysis occurring through hydrophobic layer 107. Barrier layer 106 may be formed from various materials including organic/inorganic multilayer stacks or silicon dioxide ($SiO_2$) and polyimide layers. When constructed using a combination of $SiO_2$ and polyimide layers, the $SiO_2$ layer may have a thickness of 200 nanometers and a dielectric constant of 3.9, while the polyimide layer may have a thickness of 105 nanometers and a dielectric constant of 2.9. In some embodiments, hydrophobic layer 107 is an amorphous fluoropolymer layer including any suitable fluoropolymer(s), such as AF1600, produced by DuPont, based in Wilmington, Del. Hydrophobic layer 107 may also include suitable materials that affect wettability of an adjacent material, for example.

Pixel walls 108 form a patterned electrowetting pixel grid on hydrophobic layer 107. Pixel walls 108 may comprise a photoresist material such as, for example, epoxy-based negative photoresist SU-8. The patterned electrowetting pixel grid comprises rows and columns that form an array of electrowetting pixels. For example, an electrowetting pixel may have a width and a length in a range of about 50 to 500 micrometers.

A first fluid 110, which may have a thickness (e.g., a depth) in a range of about 1 to 10 micrometers, for example, overlays hydrophobic layer 107. First fluid 110 is partitioned by pixel walls 108 of the patterned electrowetting pixel grid. A second fluid 114, such as an electrolyte solution, overlays first fluid 110 and pixel walls 108 of the patterned electrowetting pixel grid. Second fluid 114 may be electrically conductive and/or polar. For example, second fluid 114 may be, for example, a water solution or a salt solution such as potassium chloride water. First fluid 110 is immiscible with second fluid 114.

A support plate 116 covers second fluid 114 and a spacer 118 to maintain second fluid 114 over the electrowetting pixel array. In one embodiment, spacer 118 extends to support plate 116 and may rest upon a top surface of one or more of the pixel walls 108. In alternative embodiments, spacer 118 does not rest on pixel wall 108 but is substantially aligned with pixel wall 108. This arrangement may allow spacer 118 to come into contact with pixel wall 108 upon a sufficient pressure or force being applied to support plate 116. Multiple spacers 118 may be interspersed throughout the array of pixels 100. Support plate 116 may be made of glass or polymer and may be rigid or flexible, for example. In some embodiments, TFTs are fabricated onto support plate 116.

A voltage applied across, among other things, second fluid 114 and electrode layer 102 of individual electrowetting pixels may control transmittance or reflectance of the individual electrowetting pixels 100.

The reflective electrowetting display device 10 has a viewing side 120 on which an image formed by the electrowetting display device 10 may be viewed, and an opposing rear side 122. Support plate 116 faces viewing side 120 and bottom support plate 104 faces rear side 122. The reflective electrowetting display device 10 may be a segmented display type in which the image is built of segments. The segments may be switched simultaneously or separately. Each segment includes one electrowetting pixel 100 or a number of electrowetting pixels 100 that may be adjacent or distant from one another. The electrowetting display device 10 may also be an active matrix driven display type or a passive matrix driven display, for example.

As mentioned above, second fluid 114 is immiscible with first fluid 110. Herein, substances are immiscible with one another if the substances do not substantially form a solution. Second fluid 114 is electrically conductive and/or polar, and may be water or a salt solution such as a solution of potassium chloride in a mixture of water and ethyl alcohol, for example. In certain embodiments, second fluid 114 is transparent, but may be colored or absorbing. First fluid 110 is electrically non-conductive and may for instance be an alkane like hexadecane or (silicone) oil.

Hydrophobic layer 107 is arranged on bottom support plate 104 to create an electrowetting surface area. The hydrophobic character of hydrophobic layer 107 causes first fluid 110 to adhere preferentially to hydrophobic layer 107 because first fluid 110 has a higher wettability with respect to the surface of hydrophobic layer 107 than second fluid 114 in the absence of a voltage. Wettability relates to the relative affinity of a fluid for the surface of a solid. Wettability increases with increasing affinity, and it may be measured by the contact angle formed between the fluid and the solid and measured internal to the fluid of interest. For example, such a contact angle may increase from relative non-wettability of more than 90° to complete wettability at 0°, in which case the fluid tends to form a film on the surface of the solid.

First fluid 110 absorbs light within at least a portion of the optical spectrum. First fluid 110 may be transmissive for light within a portion of the optical spectrum, forming a color filter. For this purpose, the fluid may be colored by addition of pigment particles or dye, for example. Alternatively, first fluid 110 may be black (e.g., absorbing substantially all light within the optical spectrum) or reflecting. Hydrophobic layer 107 may be transparent or reflective. A reflective layer may reflect light within the entire visible spectrum, making the layer appear white, or reflect a portion of light within the visible spectrum, making the layer have a color.

If a voltage is applied across an electrowetting pixel 100, electrowetting pixel 100 will enter into an active or open state. Electrostatic forces will move second fluid 114 toward electrode layer 102 within the active pixel as hydrophobic layer 107 formed within the active electrowetting pixel 100 becomes hydrophilic, thereby displacing first fluid 110 from that area of hydrophobic layer 107 to pixel walls 108 surrounding the area of hydrophobic layer 107, to a droplet-like form. Such displacing action uncovers first fluid 110 from the surface of hydrophobic layer 107 of electrowetting pixel 100.

FIG. 1B shows one of electrowetting pixels 100 in an active state. With an electric potential applied to electrode layer 102 underneath the activated electrowetting pixel 100, second fluid 114 is attracted towards electrode layer 102 displacing first fluid 110 within the activated electrowetting pixel 100.

As second fluid 114 moves into the activated electrowetting pixel 100, first fluid 110 is displaced and moves towards a pixel wall 108 of the activated pixel 100. In the example of FIG. 1B, first fluid 110 of pixel 100a has formed a droplet as a result of an electric potential being applied to pixel 100a.

After activation, when the voltage across electrowetting pixel 100a is returned to an inactive signal level of zero or a value near to zero, electrowetting pixel 100a will return to an inactive or closed state, where first fluid 110 flows back to cover hydrophobic layer 107. In this way, first fluid 110 forms an electrically controllable optical switch in each electrowetting pixel 100.

Figure 3:
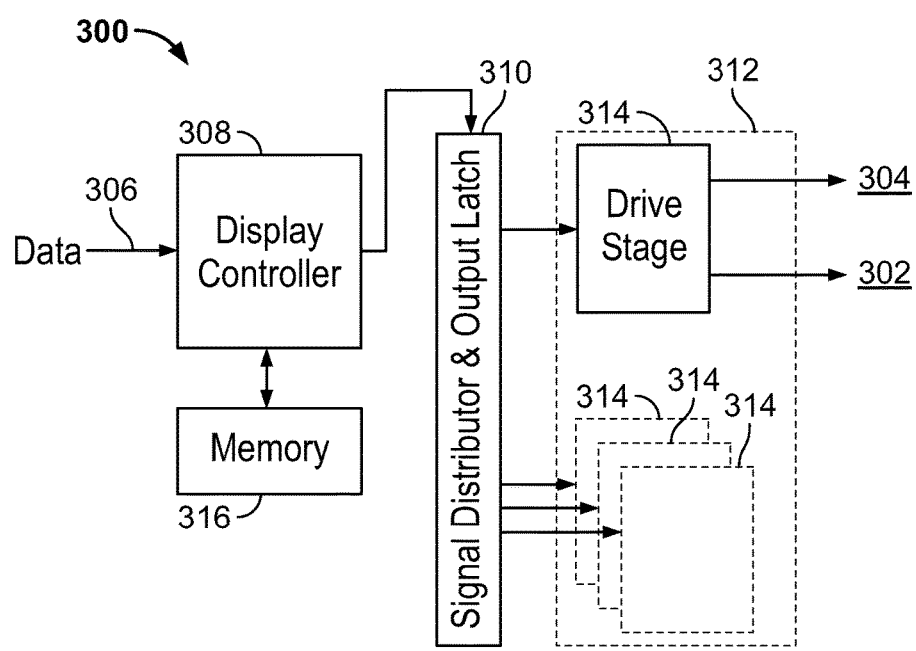
FIG. 3 shows a block diagram of an example embodiment of an electrowetting display driving system.

FIG. 3 shows a block diagram of an example embodiment of an electrowetting display driving system 300, including a control system of the display device. Display driving system 300 can be of the so-called direct drive type and may be in the form of an integrated circuit adhered to bottom support plate 104. Display driving system 300 includes control logic and switching logic, and is connected to the display by means of electrode signal lines 302 and a common signal line 304. Each electrode signal line 302 connects an output from display driving system 300 to a different electrode within each pixel 100, respectively. Common signal line 304 is connected to second fluid 114 through an electrode. Also included are one or more input data lines 306, whereby display driving system 300 can be instructed with data so as to determine which pixels 100 should be in an active or open state and which pixels 100 should be in an inactive or closed state at any moment of time. In this manner, display driving system 300 can determine a target reflectance value for each pixel 100 within the display. The data specifying the target reflectance value for each pixel 100 may explicitly set forth a particular reflectance value or, in some embodiments, may include data from which a target reflectance value or driving voltage can be determined. For example, the data may specify a particular percentage by which a particular pixel should be opened, or a particular driving voltage for the pixel. The data may also specify a particular brightness or color for a pixel or any other data indicating how a particular pixel within the display should appear. Controller 308 can then convert (if necessary) that data into target reflectance values for each pixel. Once a target reflectance value is determined for a particular pixel, controller 308 sets the reflectance value of the pixel to that target reflectance value by converting the reflectance value into a corresponding driving voltage to be subjected to the electrode of the pixel. That driving voltage is then applied to the appropriate electrode signal line 302. In the present disclosure, the reflectance value of a particular pixel may relate to or provide some indication of the actual reflectance of the pixel. The reflectance value is not necessarily a measure of the pixel's actual reflectance, but is a value that is intended to scale with or relate to the pixel's actual reflectance. The reflectance value may be expressed as a numerical value utilized by display driving system 300 to select an appropriate driving voltage for a pixel.

Electrowetting display driving system 300 as shown in FIG. 3 includes a display controller 308, e.g., a microcontroller, receiving input data from the input data lines 306 relating to the image to be displayed. Display controller 308, being in this embodiment the control system, is configured to apply a voltage to the first electrode to establish a particular display state (i.e., reflectance value) for a pixel 100. The microcontroller controls a timing and/or a signal level of at least one signal level for a pixel 100.

The output of display controller 308 is connected to the data input of a signal distributor and data output latch 310. The signal distributor and data output latch 310 distributes incoming data over a plurality of outputs connected to the display device, via drivers in certain embodiments. The signal distributor and data output latch 310 cause data input indicating that a certain pixel 100 is to be set in a specific display state to be sent to the output connected to pixel 100. The distributor and data output latch 310 may be a shift register. The input data is clocked into the shift register and at receipt of a latch pulse the content of the shift register is copied to the distributor and data output latch 310. The distributor and data output latch 310 has one or more outputs, connected to a driver assembly 312. The outputs of the distributor and data output latch 310 are connected to the inputs of one or more driver stages 314 within the electrowetting display driving system 300. The outputs of each driver stage 314 are connected through electrode signal lines 302 and common signal line 304 to a corresponding pixel 100. In response to the input data, a driver stage 314 will output a voltage of the signal level set by display controller 308 to set one of pixels 100 to a corresponding display state having a target reflectance level.

Figure 4A:
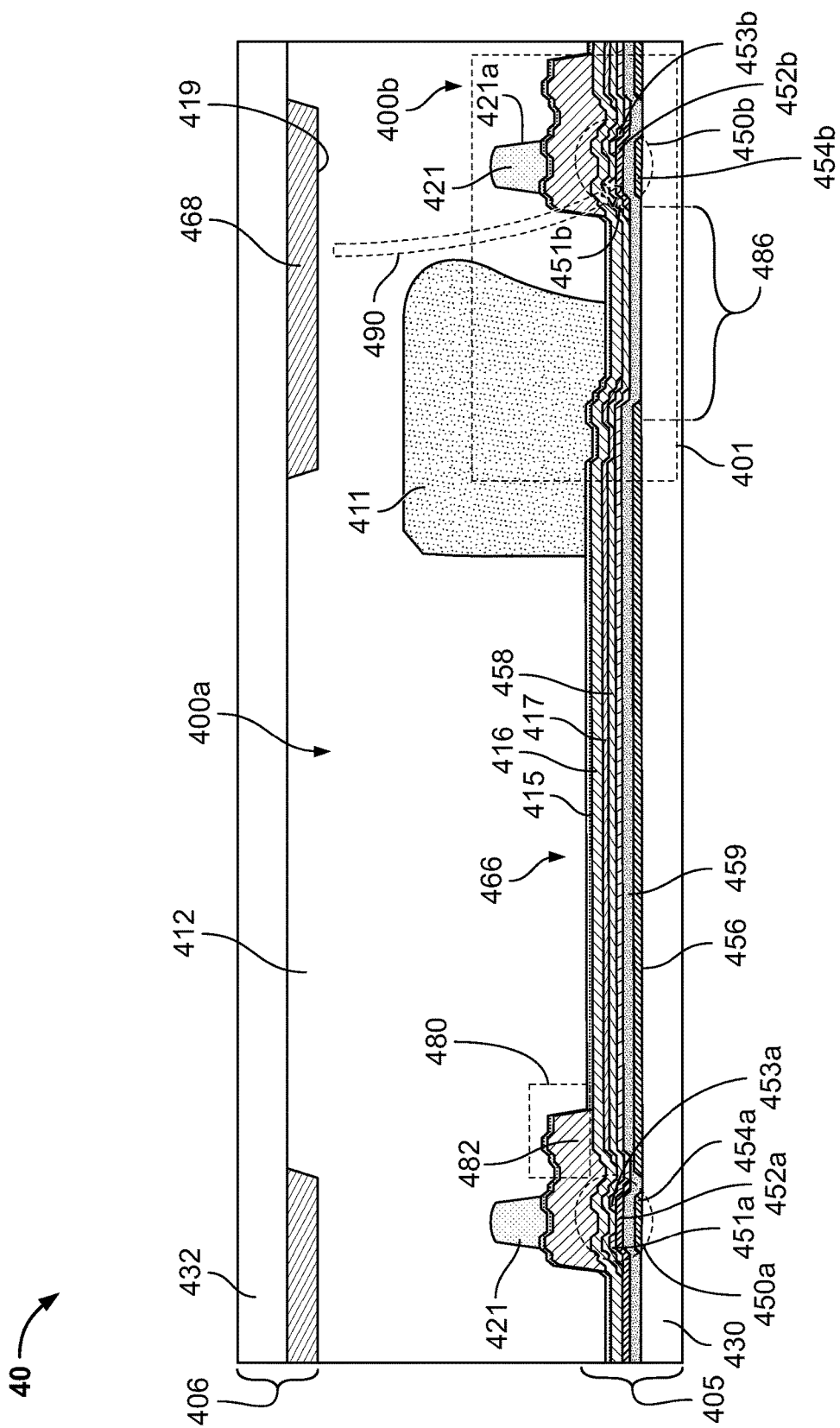
FIG. 4A is a diagrammatic cross-sectional view of an electrowetting display device including an electrowetting pixel
Figure 4B:
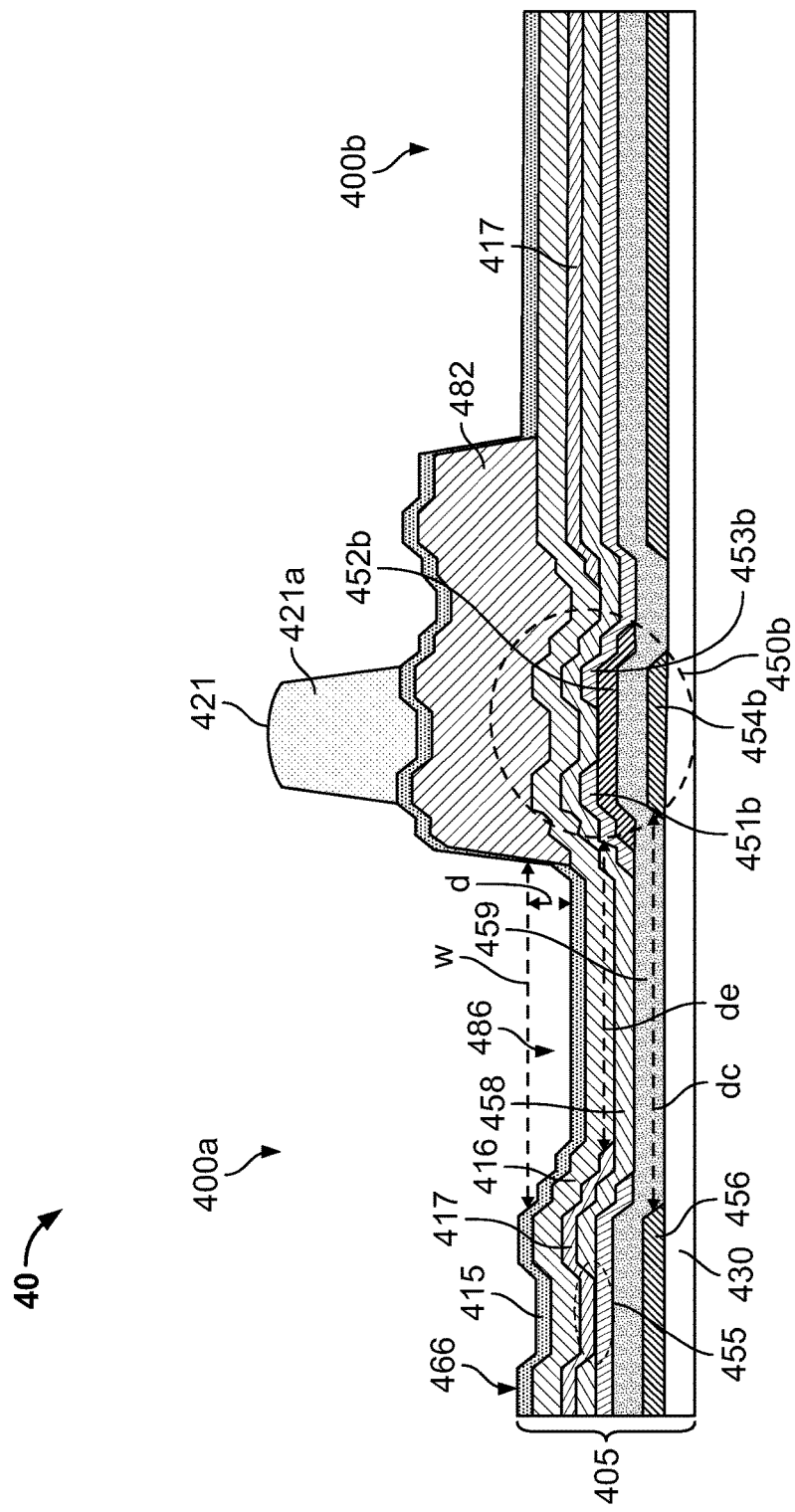
FIG. 4B shows an enlarged view of a region of FIG. 4A.
Figure 4C:
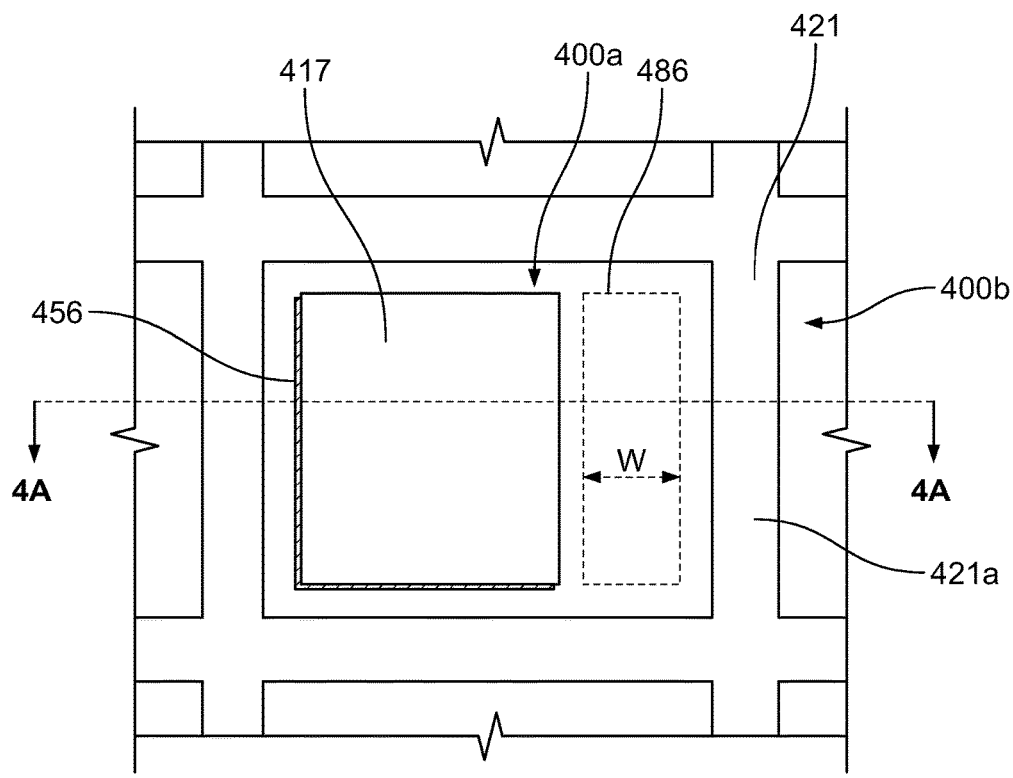
FIG. 4C is a simplified top view of the pixel of FIG. 4A.

FIG. 4A is a diagrammatic cross-sectional view of electrowetting display device 40 including electrowetting pixel 400a. Pixel 400a is configured similarly to pixel 100 of FIGS. 1A, 1B and 2, but FIG. 4A depicts additional structural detail of pixel 400a. FIG. 4B shows an enlarged view of region 401 of pixel 400a. FIG. 4B is a simplified illustration and does not include some features of FIG. 4A including fluids 411 and 412. FIG. 4C is a simplified top view of pixel 400a. The cross-sectional view of FIG. 4A is taken along line 4A-4A of FIG. 4C.

Device 40 includes a first support plate 405 and a second support plate 406. First support plate 405 and second support plate 406 may include a glass or polymer substrate 430 and substrate 432, respectively, and may be rigid or flexible.

A boundary of pixel 400a is defined by pixel walls 421 of pixel 400a, which are formed over support plate 405. Pixel 400a defines a volume or space, which may otherwise be considered to be a chamber, between support plates 405 and 406, and which may be filled with a plurality of fluids. In the example of FIG. 4A, the space is filled with first fluid 411 and second fluid 412. Bottom surface 466 of pixel 400a defines a pixel area that is a region at the bottom of the volume defined by pixel 500a with an outer perimeter defined by the inner perimeter of pixel walls 421 that define pixel 400a.

First fluid 411 is electrically non-conductive and may absorb at least a part of the visible light spectrum. First fluid 411 may be translucent for a part of the visible light spectrum, thereby forming a color filter. In other embodiments, color filtering structures may be formed in pixel 400a to associate pixel 400a with a particular color. For example, color filters (not shown), may be formed over a surface of or within top support plate 406 to filter light passing therethrough. First fluid 411 may also be colored by addition of pigment particles or a dye. In some examples, first fluid 411 may be configured to absorb substantially all light incident thereupon. In some examples, first fluid 411 may absorb 90% or more of light in the visible spectrum and incident thereupon.

First fluid 411 may be confined to pixel 400a by pixel walls 421, which follow the cross-section of pixel 400a. The cross-section of a pixel may have any shape. When the pixels are arranged in a matrix form, the cross-section of each pixel may usually be square or rectangular. Pixel walls 421 are shown as structures formed or disposed on a surface of and protruding from wettable layer 410. In various examples, forming, disposing, or otherwise arranging an element of an electrowetting pixel may be accomplished through chemical vapor deposition (CVD), or one of its variants, such as plasma-enhanced chemical vapor deposition, or physical vapor deposition (PVD), and other processes known to those of skill in the art. Further, forming or disposing a second structure (e.g. a wall) on a first structure (e.g. a surface) may mean directly on (e.g., in contact with) or indirectly on, such as where there are one or more intervening structures (e.g., layers) and the second structure is above, overlying, or overlapping the first structure aspect through the intervening structures.

Second fluid 412 is electrically conductive, polar, or both. Second fluid 412 may be translucent or colored. First fluid 411 is substantially immiscible with second fluid 412. Due to the immiscibility of first fluid 411 with second fluid 412, first fluid 411 and second fluid 412 tend to remain separated from each other, therefore tending not to mix together to form a homogeneous mixture. Instead, first fluid 411 and second fluid 412 may meet each other at an interface, which may alternatively be referred to as a boundary or a meniscus.

FIG. 4A depicts an example of an interface between first fluid 411 and second fluid 412 that may exist when a driving voltage is applied to pixel 400a. When the applied driving voltage is a sufficient, non-zero driving voltage, as in FIG. 4A, the configuration of first fluid 411 and second fluid 412 within pixel 400a is altered. As shown, in the on state, second fluid 412 is drawn into pixel 400a towards surface 466 causing first fluid 411 to be displaced from an off-state configuration in which first fluid 411 is distributed evenly over surface 466 of pixel 400a.

First support plate 405 includes wettable or hydrophobic layer 415, which may include a fluoropolymer material. Hydrophobic layer 415 is formed over barrier layer 416. Pixel electrode 417 is formed as part of support plate 405. In this example, there is one pixel electrode 417 per pixel 400, though other pixel electrode configurations may be used. Pixel electrode 117 may be of any desired shape or form.

Pixel electrode 417 can act as a reflective surface, such as in the case of a reflective type pixel. In such examples, pixel electrode 417 may be formed of a reflective and conductive material, such as a metallic material.

Second support plate 406 includes electrode 419, which is connected to second signal line (not shown), and which extends between walls of pixel 400a. In some examples, electrode 419 may be disposed or formed, for example located, above and/or covering, overlying, or overlapping the walls of pixel 400a and/or extend uninterruptedly over a plurality of pixels. Alternatively, electrode 419 may be arranged at a border of second support plate 406, where electrode 419 is in electrical contact with second fluid 412. Electrode 419 is common to all pixels 400a in device 40. Pixel electrode 417 and electrode 419 may be made of, for example, a translucent conductive material, such as indium tin oxide (ITO). Second support plate 406 includes black matrix material 468, which may be formed or located over pixel walls 421 of device 40. Generally, black matrix material 468 includes a light-absorbing material and is configured to block or otherwise absorb light that may strike a surface of device 40 and, rather than entering pixel 400a, enter pixel walls 421 of device 40.

A switching element is used to control the driving voltage applied to pixel electrode 417. FIG. 4A depicts two such transistors—the first transistor 450a controls the application of a driving voltage to pixel electrode 417 of pixel 400a, while the second transistor 450b controls the application of a driving voltage to the neighboring pixel 400b to the right (as viewed in FIG. 4A only partial view of pixel 400b is provided) of pixel 400a. In this example, pixel 400b is adjacent to pixel 400a within the array of pixels contained within device 40. In this example, the switching element is a transistor such as a TFT, which is located in first support plate 405.

Transistor 450a includes a source terminal 451a, a drain terminal 453a, which is electrically connected to pixel electrode 417, a semiconducting channel 452a connecting source terminal 451a to drain terminal 453a, and a gate terminal 454a.

In various embodiments, terminals, such as the gate, source and drain terminals, may be electrically conductive structures, such as a node, trace, or other types of connections in an electronic circuit. While the figures depict various example terminals with specific shapes and arrangements, those of skill in the art will appreciate that such terminals may have other shapes and arrangement as the case may be, and may include complex geometries.

One or more of gate terminal 454a, source terminal 451a, and drain terminal 453a may comprise materials such as molybdenum, aluminum, titanium, copper, or other conductive materials as are known by those of skill in the art, such as other metals and metal alloys. Further, in this example, gate terminal 454a is separated from semiconducting channel 452a by an insulating layer 459, which may comprise a dielectric material thereby electrically insulating gate terminal 454a from semiconducting channel 452a. Further, source terminal 451a, semiconducting channel 452a, and drain terminal 453a may be separated from pixel electrode 417 by insulating layer 458, which may comprise a dielectric material.

Semiconducting channel 452a is formed from a doped semiconducting material, such as, for example, Silicon (Si), Silicon Germanium (SiGe), Germanium (Ge), Indium Arsenide (InAs), and the like or any combination thereof. The semiconducting channel 452a is doped to be either an n-type or p-type region. During operation, and without any control voltage being applied to gate terminal 454a of transistor 450a, semiconducting channel 452a includes a depleted region that does not contain any charge carriers. As such, semiconducting channel 452a operates as an insulator and does not transmit electricity. As such, source terminal 451a and drain terminal 453a are electrically isolated from one another.

When, however, a control voltage is applied to gate terminal 454a, charge carriers are attracted into the depleted region of semiconducting channel 452a. This allows semiconducting channel 452a to conduct electricity, electrically connecting source terminal 451a and drain terminal 453a.

In this manner, gate terminal 454a acts as a control terminal that determines whether semiconducting channel 452a is electrically conductive and whether a charge applied to source terminal 451a will be conducted through semiconducting channel 452a and drain terminal 453a.

Transistor 450b is similarly configured to transistor 450a. Transistor 450b includes source terminal 451b, drain terminal 453b, gate terminal 454b, and semiconducting channel 452b. As depicted in FIG. 4A, both transistor 450a and transistor 450b are each at least partially located underneath pixel walls 421.

Drain terminal 453a of transistor 450a is electrically connected to electrode 417 via contact hole 455, which may be, for example, a via, or other electrical interconnect as are known by persons of skill in the art. Contact hole 455 may be formed through insulating layer 458 by, for example, physical or chemical etching, and other methods as are known by those of skill in the art. Once formed, contact hole 455 may have a conductive material, such as a metallic material, deposited on its inner surface in order to electrically connect drain terminal 453a with electrode 417.

Source terminal 451a of transistor 450a may be supplied with a voltage by a source signal line (not shown). Gate terminal 454a is supplied with a voltage by a gate signal line (not shown). As is known to the skilled person, a voltage may be applied to pixel electrode 417 by applying a suitable electric potential or control voltage to gate terminal 454a, which thereafter changes a state of the semiconducting channel 452a from an electrically non-conducting state to an electrically conducting state. Thus, the transistor may be switched to an electrically conducting state so that the voltage applied to source terminal 451a may be conducted via semiconducting channel 452a to electrode 417 via drain terminal 453a. In other words, a flow of electric current between source terminal 451a and drain terminal 453a, via semiconducting channel 452a, is controllable by application of a control voltage to gate terminal 454a.

In examples of active matrix pixels, source terminal 451a may be connected by a source signal line (not shown) to a column driver (not shown) and gate terminal 454a may be connected by a gate signal line (not shown) to a row driver (not shown) in order to control the magnitude of and when an electric potential is applied to pixel electrode 417a thereby further controlling a configuration of first fluid 411 and second fluid 412.

First support plate 405 includes bottom electrode 456, which may form a storage capacitor in combination with pixel electrode 417. Common electrode 456 is separated from pixel electrode 417 by at least insulating layer 459 and is connected to a common voltage node, enabling bottom electrode 456 to be set to a common voltage of device 40. Bottom electrode 456, as illustrated by FIG. 4C has a similar shape and size to that of pixel electrode 417. By storing charge on pixel electrode 417, a voltage may be applied between pixel electrode 417 and electrode 419 for longer after switching transistor 450a off by removing the electric potential from gate terminal 454a.

As described above, when a zero or substantially zero voltage is applied between pixel electrode 417 and electrode 419, i.e., when the electrowetting pixel is in an off state, first fluid 411 forms a layer extending between the walls 421 of pixel 400a. When a non-zero voltage is applied to pixel electrode 117 (as shown in FIG. 4A), i.e., when the electrowetting pixel is in an on state with a driving voltage, second fluid 412 will displace first fluid 411 such that first fluid 411 will retract (or contract) towards a pixel wall 421 of pixel 400a as shown by the shape of first fluid 411 in FIG. 4A. Accordingly, the controllable displacement of first fluid 411 in dependence on the magnitude of the applied voltage is used to operate the pixel as a light valve and to provide a display effect.

When applying a driving voltage to pixel electrode 417 to open pixel 400a, it is generally desirable that first fluid 411 move in a predictable direction within pixel 400a. With reference to FIG. 4A, pixel 400a is generally configured to promote first fluid 411 movement to the right in response to a driving voltage being applied to pixel electrode 417. To promote first fluid 411 movement in that direction, pixel 400a includes an insulated notch 480 at the left side of pixel 400a. Insulated notch 480 includes a layer of insulating material 482, such as silicon nitride, formed beneath the corresponding pixel wall 421. Insulated notch 480 protrudes into pixel 400a and is raised above surface 466 of pixel 400a. Insulated notch 480 tends to promote the movement of first fluid 411 in response to a driving voltage towards the right side of pixel 400a as viewed in FIG. 4A. In the configuration shown in FIG. 4A, insulated notch 480 is located opposite pixel wall 421a and fluid accumulation region 486 of pixel 400a.

To further control first fluid 411 movement within pixel 400a in response to a driving voltage, pixel 400a includes fluid accumulation region 486. Fluid accumulation region 486 is a recessed region of surface 466 of pixel 400a. As first fluid 411 is displaced in response to a driving voltage, first fluid 411 forms a droplet shape and accumulates within fluid accumulation region 486. Fluid accumulation region 486 has a width w of approximately 8 micrometers and a depth d of approximately 0.75 micrometers. The depth of the fluid accumulation region 486 may be defined as the vertical distance between the bottom surface of fluid accumulation region 486 and the surface 466 of pixel 400a surrounding fluid accumulation region 486. Fluid accumulation region 486 is located proximate or nearest to pixel wall 421a out of the pixel walls 421 surrounding pixel 400a. As such, pixel wall 421a is opposite from the pixel wall 421 located over switch 450a.

Pixel 400a is configured so that the metal components of pixel 400a (i.e., pixel electrode 417 and bottom electrode 456 are not formed underneath fluid accumulation region 486. Instead, the structure underneath fluid accumulation region 486 includes non-metallic layers, such as hydrophobic layer 415, barrier 416, insulating layer 458, and insulating layer 459. In this example configuration, a horizontal distance de between the edge of pixel electrode 417 and source terminal 451b (representing the minimum distance between pixel electrode 417 and source terminal 451b) ranges from approximately 8 micrometers to 10 micrometers and is generally greater than or equal to 9 micrometers and a horizontal distance db between the edge of bottom electrode 456 and gate terminal 454b (representing the minimum distance between bottom electrode 456 and gate terminal 454b) is approximately 8 micrometers to 10 micrometers and is generally greater than or equal to 9 micrometers.

In various implementations of display devices, however, the dimensions of fluid accumulation area 486 may be partially determined by the size of the display area, the number of pixels within the display area and the driving scheme, namely the number of display frames per second.

In an ideal implementation, upon application of a driving voltage, first fluid 411 would form a droplet within fluid accumulation region 486 that is displaced as far to the right as possible within pixel 400a as viewed in FIG. 4A. In this configuration, the droplet of first fluid 411 could be ideally in contact with the pixel wall 421a nearest to or proximate the fluid accumulation region 486.

In some situations, however, the operation of transistor 450b—the transistor that controls the application of a driving voltage to the pixel neighboring pixel 400a—can interfere with the movement of first fluid 411 within pixel 400a. As depicted in FIG. 4A, this interference can sometimes prevent first fluid 411 from forming a droplet in response to a driving voltage that is in contact with the pixel wall 421a nearest to fluid accumulation region 486. Instead, the operation of transistor 450b can cause first fluid 411 to break away from the pixel wall 421a nearest to fluid accumulation region 486. This prevents first fluid 411 from moving as far to the right of pixel 400a as possible.

During operation of device 40, the various pixels of device 40 are addressed according to an addressing scheme. Generally, the pixels are addressed one row at a time. Accordingly, the source terminals of a first row of pixels is supplied with the pixels' respective driving voltages. Control signals are then supplied to each of the gate terminals of the pixels' transistors, causing the pixel electrode of each pixel to be subjected to that pixel's respective driving voltage. After all pixels in the row of pixels have been addressed (i.e., their pixel electrodes have been set to their respective driving voltages), the addressing scheme moves on to the next row of pixels and the process repeats.

Figure 4D:
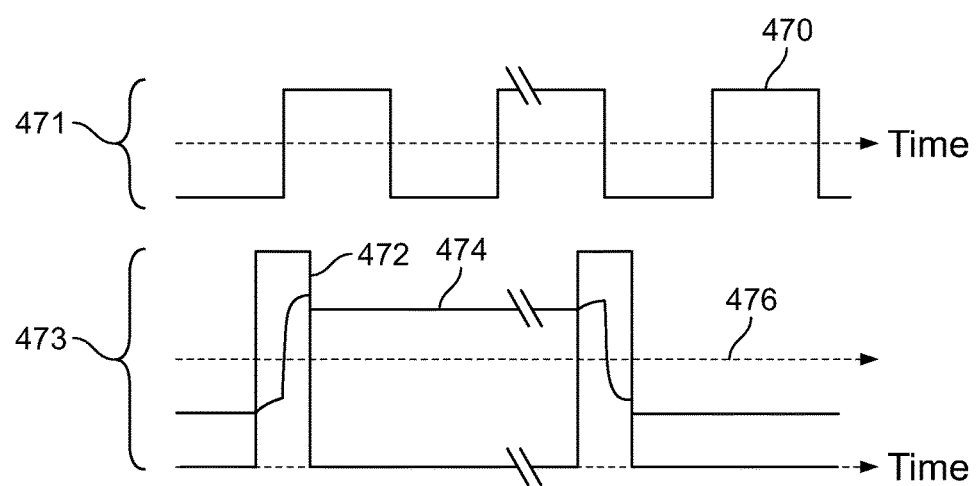
FIG. 4D includes graphs depicting control signals that may be applied to a pixel in an electrowetting display device.

To illustrate, FIG. 4D includes two graphs 471 and 473, each graph depicting control signals that may be applied to a pixel in device 40 to a particular driving voltage. The horizontal axis of both graphs depicts time, while the vertical axis depicts voltage. In the first graph, data signal 470 represents a voltage that may be subjected to a particular pixel. This data signal may represent, for example, the desired driving voltage for a pixel and may be applied to the source terminal of that pixel's transistor. As depicted, data signal 470 is not maintained at a constant value, and may only periodically be set to the desired driving voltage. For example, data signal 470 may only be set to a non-zero voltage when the pixel is actually being addressed.

As described above, however, data signal 470 (which may represent a driving voltage) will not be passed along to the pixel's pixel electrode until that pixel's control switch is turned on. Accordingly, switch signal 472 represents a control voltage that may be applied to the pixel's controlling switch. Generally, switch signal 472 will be applied to a gate terminal of a transistor that operates as the pixels' controlling switch. When a non-zero switch signal 472 is supplied to the pixel's control switch, data signal 470 will be passed along to the pixel's pixel electrode causing a driving voltage to accumulate on the pixel electrode. This accumulating driving voltage is illustrated by line 474. As illustrated, when switch signal 472 is a non-zero value, and, at the same time, data signal 470 has a non-zero value, a driving voltage will accumulate on the pixel's electrode. When the pixel electrode has reached the desired driving voltage, control signal 472 can be set to a minimum voltage and the switch turned off. The set driving voltage will remain on the pixel electrode until the next addressing cycle in which another driving voltage is applied to the pixel's pixel electrode. Alternatively, in the next addressing cycle, the same driving voltage may be applied to the pixel electrode in order to refresh the charge stored thereon.

With respect to pixel 400a depicted in FIG. 4A, therefore, for the majority of the addressing period (i.e., the time required to address all pixels in device 40), source terminal 451b and gate terminal 454b are set to minimum voltages and have no effect on either of first fluid 411 or second fluid 412 of pixel 400a. But, when pixel 400b to the right of pixel 400a is being addressed, both source terminal 451b and gate terminal 454b may be set to non-minimum voltages that are greater than the common voltage of device 40 (see common voltage line 476 of FIG. 4D). Specifically, source terminal 451b may be set to the desired driving voltage for pixel 400b and the gate terminal 454b may be set to a control voltage configured to turn on transistor 450b enabling the pixel electrode of pixel 400b to be set to the desired driving voltage.

When pixel 400b is being addressed, the voltages of source terminal 451b and gate terminal 454b of transistor 450b can generate fringe electric fields in combination with electrode 419. The fringe field 490 is depicted by a dashed arrow in FIG. 4A. The fringe electric field 490 tends to promote the movement of second fluid 412 downwards into pixel 400a which, in turn, promotes the movement of first fluid 411 away from the pixel wall 421a nearest fluid accumulation region 486. Consequently, as shown in FIG. 4A, the droplet formed by first fluid 411 may not be entirely hidden underneath black matrix material 468. First fluid 411, then, is not hidden from view of the observer, potentially resulting in reduced reflectance and lower contrast ratio of pixel 400a, even when subjected to a maximum driving voltage. This, in turn, can reduce the front of screen performance of device 40 resulting in noticeable visual artifacts for a viewer of device 40.

To mitigate this problem, in the present electrowetting display pixel design, the bottom electrode formed over the bottom support plate is reconfigured to at least partially extend beneath the pixel's fluid accumulation region. Because the bottom electrode on the bottom support plate has the same electric potential as the electrode on the top plate, in this configuration the strength of the electric fringe field formed between the neighboring pixel's transistor and the electrode of the top support plate is minimized. This results because the fringe field is instead formed between the neighboring pixel's transistor and the bottom electrode on the bottom plate. In that arrangement, the fringe field exerts a reduced, and possibly negligible, electric field upon the fluids contained within the pixel. As a result, oil collected within the fluid accumulation region of the pixel is less likely to be displaced out of the collection region by the fringe field formed by an electric potential applied to the terminals of the neighboring pixel's control transistor.

Figure 5A:
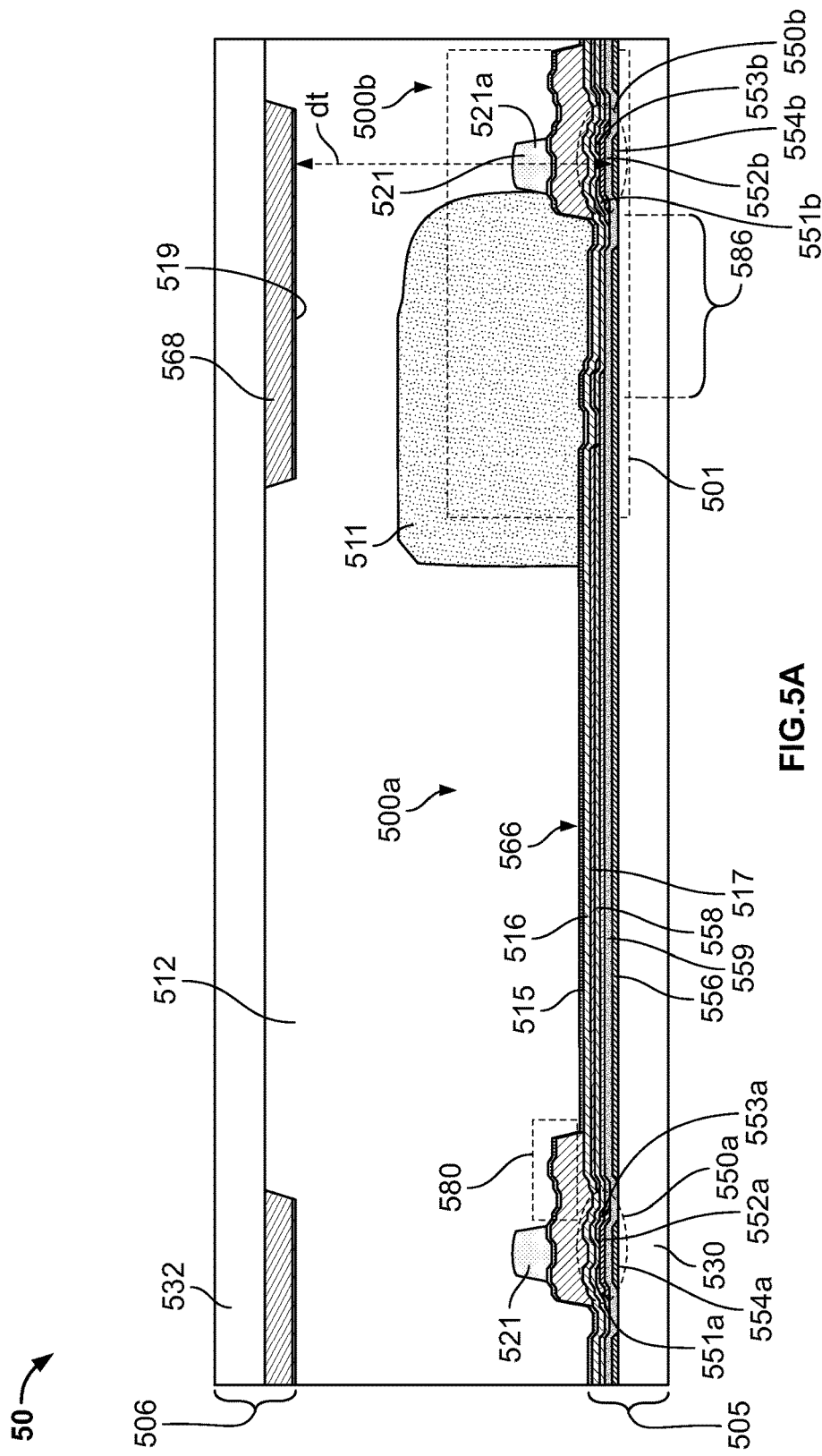
FIG. 5A is a diagrammatic cross-sectional views of an electrowetting display device including an electrowetting pixel configured in accordance with the present disclosure.
Figure 5B:
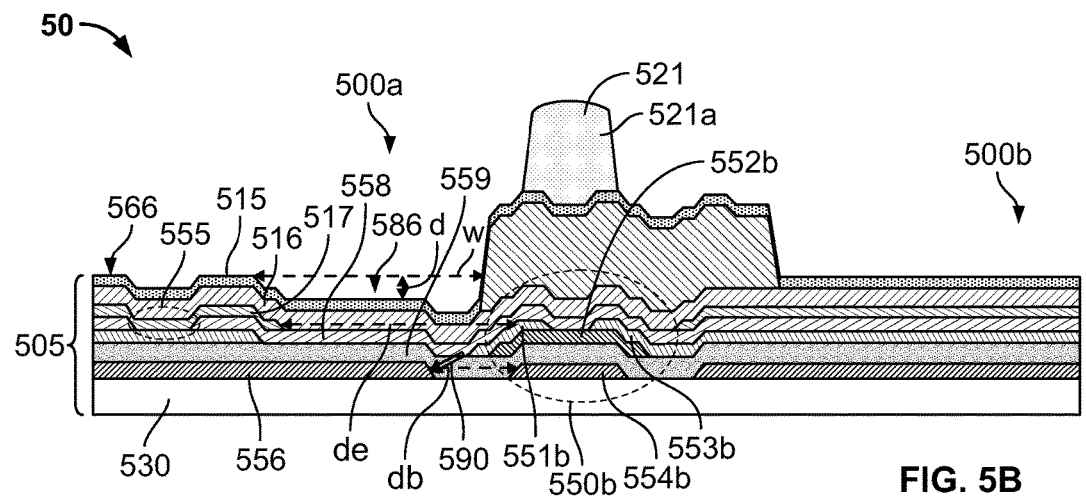
FIG. 5B shows an enlarged view of a region of FIG. 5A.
Figure 5C:
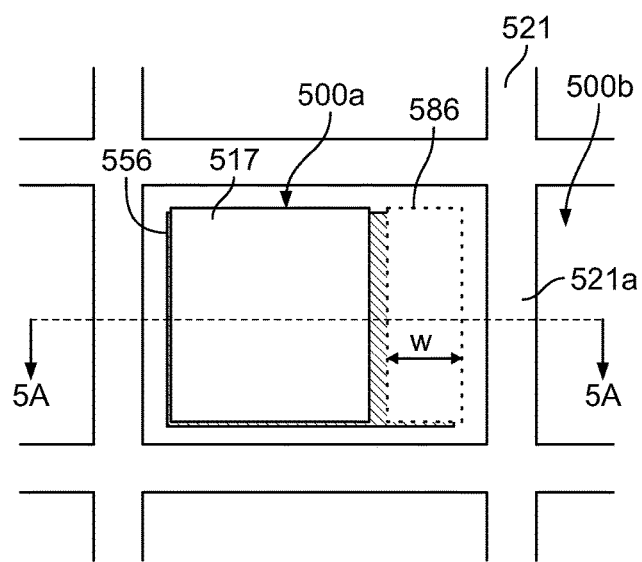
FIG. 5C is a simplified top view of the pixel of FIG. 5A.

FIG. 5A is a diagrammatic cross-sectional views of electrowetting display device 50 including electrowetting pixel 500a. Pixel 500a is configured in accordance with the present disclosure to provide improved control of fluid movement within pixel 500a. Specifically, a configuration of bottom electrode 556 of pixel 500a is modified from conventional designs to control the formation of fringe electric fields within pixel 500a. FIG. 5B shows an enlarged view of region 501 of pixel 500a. FIG. 5B is a simplified illustration and does not include some features of FIG. 5A including fluids 511 and 512. FIG. 5C is a simplified top view of pixel 500a. The cross-sectional view of FIG. 5A is taken along line 5A-5A of FIG. 5C.

Device 50 includes a first support plate 505 and a second support plate 506. First support plate 505 and second support plate 506 may include a glass or polymer substrate 530 and substrate 532, respectively, and may be rigid or flexible.

Boundaries of pixels 500a and 500b are defined by pixel walls 521, which are formed over support plate 505. Pixel 500a defines a volume or space containing first fluid 511 and second fluid 512. Bottom surface 566 of pixel 500a defines a pixel area that is a region at the bottom of the volume defined by pixel 500a with an outer perimeter defined by the inner perimeter of pixel walls 521 that define pixel 500a.

First fluid 511 is electrically non-conductive and may absorb at least a part of the visible light spectrum. Second fluid 512 is electrically conductive, polar, or both. Second fluid 512 may be translucent or colored. First fluid 511 is substantially immiscible with second fluid 512.

FIG. 5A depicts an example of an interface between first fluid 511 and second fluid 512 that may exist when a driving voltage is applied to pixel 500a. As shown, in the on state, second fluid 512 is drawn into pixel 500a towards surface 566 causing first fluid 511 to be displaced from an off-state configuration in which first fluid 511 is distributed evenly over surface 566 of pixel 500a.

First support plate 505 includes wettable or hydrophobic layer 515, which may include a fluoropolymer material. Hydrophobic layer 515 is formed over barrier layer 516. Pixel electrode 517 is formed as part of support plate 505. Pixel electrode 517 can act as a reflective surface, such as in the case of a reflective type pixel.

Second support plate 506 includes electrode 519, which is connected to second signal line (not shown), and which extends between walls 521 of pixel 500a. In some examples, electrode 519 may be disposed or formed, for example located, above and/or covering, overlying, or overlapping the walls 521 of pixel 500a and/or extend uninterruptedly over a plurality of pixels. Second support plate 506 includes black matrix material 568, which may be formed or located over pixel walls 521 of device 50. Generally, black matrix material 568 includes a light-absorbing material and is configured to block or otherwise absorb light that may strike a surface of device 50 and, rather than entering pixel 500s, enter pixel walls 521 of device 50.

A switching element is used to control the driving voltage applied to pixel electrode 517. FIG. 5A depicts two such transistors—the first transistor 550a controls the application of a driving voltage to pixel electrode 517 of pixel 500a, while the second transistor 550b controls the application of a driving voltage to the neighboring pixel 500b to the right (as viewed in FIG. 5A) of pixel 500a. Pixel 500b is adjacent to pixel 500a in the array of pixels of device 50. In this example, the switching element is a transistor such as a thin film transistor (TFT), which is located in first support plate 505.

Transistor 550a includes a source terminal 551a, a drain terminal 553a, which is electrically connected to pixel electrode 517, a semiconducting channel 552a connecting source terminal 551a to drain terminal 553a, and a gate terminal 554a. Similarly, transistor 550b includes a source terminal 551b, a drain terminal 553b, a semiconducting channel 552b, and a gate terminal 554b. As depicted in FIG. 5A, both transistor 550a and transistor 550b are each at least partially located underneath pixel walls 521.

Gate terminal 554a of transistor 550a is separated from semiconducting channel 552a by an insulating layer 559, which may comprise a dielectric material thereby electrically insulating gate terminal 554a from semiconducting channel 552a. Further, source terminal 551a, semiconducting channel 552a, and drain terminal 553a may be separated from pixel electrode 517 by insulating layer 558, which may comprise a dielectric material. Semiconducting channel 552a is formed from a doped semiconducting material, such as, for example, Si, SiGe, Ge, InAs, and the like.

When a control voltage is applied to gate terminal 554a, charge carriers are attracted into the depleted region of semiconducting channel 552a. This allows semiconducting channel 552a to conduct electricity, electrically connecting source terminal 551a and drain terminal 553a.

Drain terminal 553a is electrically connected to electrode 517 via contact hole 555, which may be, for example, a via, or other electrical interconnect as are known by persons of skill in the art.

First support plate 505 includes bottom electrode 556, which may form a storage capacitor in combination with pixel electrode 517. Bottom electrode 556 is separated from pixel electrode 517 by at least insulating layer 559 and is connected to a common voltage node, enabling bottom electrode 556 to be set to a common voltage of device 50. As depicted in FIG. 5C, in one embodiment, bottom electrode 556 is generally configured to have a width that is similar to that of pixel electrode 517, while a length of bottom electrode 556 is greater than that of pixel electrode 517. By storing charge on pixel electrode 517, a voltage may be applied between pixel electrode 517 and electrode 519 for a period of time after switching transistor 550a off by removing the electric potential from gate terminal 554a.

As described above, when a zero or substantially zero voltage is applied between pixel electrode 517 and electrode 519, i.e., when electrowetting pixel 500a is in an off state, first fluid 511 forms a layer extending between the walls 521 of pixel 500a. When a non-zero voltage is applied to pixel electrode 517 (as shown in FIG. 5A), i.e., when the electrowetting pixel is in an on state, second fluid 512 will displace first fluid 511 such that first fluid 511 will retract (or contract) towards a pixel wall 521 of pixel 500a as shown by the shape of first fluid 511 in FIG. 5A. Accordingly, the controllable displacement of first fluid 511 in dependence on the magnitude of the applied voltage is used to operate the pixel as a light valve and to provide a display effect.

When applying a driving voltage to pixel electrode 517 to open pixel 500a, it is generally desirable that first fluid 511 move in a predictable direction within pixel 500a. With reference to FIG. 5A, pixel 500a is generally configured to promote first fluid 511 movement to the right in response to a driving voltage being applied to pixel electrode 517. To promote first fluid 511 movement in that direction, pixel 500a includes an insulated notch 580 at the left side of pixel 500a. Insulated notch 580 includes a layer of insulating material 582, such as silicon nitride, formed beneath the corresponding pixel wall 521. Insulated notch 580 protrudes into pixel 500a and is raised above surface 566 of pixel 500a. Insulated notch 580 tends to promote the movement of first fluid 511 in response to a driving voltage towards the right side of pixel 500a as viewed in FIG. 5A. In the configuration shown in FIG. 5A, insulated notch 580 is located opposite pixel wall 521a and fluid accumulation region 586 of pixel 500a.

To further promote first fluid 511 movement and retention at the right of pixel 500a in response to a driving voltage, pixel 500a includes fluid accumulation region 586. Fluid accumulation region 586 is a recessed region of surface 566 of pixel 500a that may optionally be formed in pixel 500a to provide further control over fluid movement within pixel 500a. Fluid accumulation region 586 is generally formed as a recessed region of hydrophobic layer 515 and may include recesses in other layers of support plate 505, such as barrier layer 516. As first fluid 511 is displaced in response to a driving voltage, first fluid 511 forms a droplet shape and accumulates within fluid accumulation region 586. In an embodiment, fluid accumulation region 586 has a width w of approximately 8.5 micrometers and a depth d of approximately 0.5 micrometers. The depth of the fluid accumulation region 586 may be defined as the vertical distance between the bottom surface of fluid accumulation region 586 and the surface 566 of pixel 500a surrounding fluid accumulation region 586. Fluid accumulation region 586 is located proximate or nearest to pixel wall 521a out of the pixel walls 521 surrounding pixel 500a. As such, pixel wall 521a is opposite from the pixel wall 521 located over switch 550a.

As depicted, in pixel 500a, bottom electrode 556 extends underneath a portion of fluid accumulation region 586.

In the present system, as described below, it may be beneficial to minimize a distance db between the edge of bottom electrode 556 and gate terminal 554a. This can promote the formation of fringe electric fields between gate terminal 554a and bottom electrode 556, rather than between gate terminal 554a and common electrode 519, where the fringe fields may interfere with movement of first fluid 511. In an embodiment, therefore, device 50 is fabricated so that the distance db is a minimal distance.

When device 50 is fabricated using photolithographic techniques, for example, those techniques can define a minimum feature size for components of the fabricated devices. That minimum feature size, in turn, sets a minimum distance that must separate bottom electrode 556 and gate terminal 554a and still be in accordance with the design rules of the photolithography processes. In that case, device 50 may be fabricated so that the distance db between bottom electrode 556 and gate terminal 554a is the smallest achievable distance in accordance with the design rules. In such a configuration, the distance db between the edge of bottom electrode 557 and gate terminal 554a may be substantially less than the minimum distance dt between common electrode 519 on top support plate 506 and gate terminal 554a (see dimension dt on FIG. 5A). In various embodiments, the distance db between the edge of bottom electrode 557 and gate terminal 554a may equal to or less than the distance dt between common electrode 519 on top support plate 506 and gate terminal 554a. In some other cases, the distance db between the edge of bottom electrode 557 and gate terminal 554a may equal to or less than ¼ of the minimum distance dt between common electrode 519 on top support plate 506. Additionally, in this configuration, the minimum distance db between bottom electrode 556 and gate terminal 554a is less than the minimum distance de between pixel electrode 517 and source terminal 551b of transistor 550b. For example, in one specific implementation, the distance db between the edge of bottom electrode 557 and gate terminal 554a may approximately 5 micrometers when the minimum distance dt between common electrode 519 on top support plate 506 is approximately 20 micrometers.

In an example device, horizontal distance de between the edge of pixel electrode 517 and source terminal 551b (representing the minimum distance between pixel electrode 517 and source terminal 551b) ranges from approximately 8 micrometers to 10 micrometers and is generally greater than or equal to 9 micrometers and a horizontal distance db between the edge of bottom electrode 556 and gate terminal 554a (representing the minimum distance between bottom electrode 556 and source terminal 554b) is equal to or less than 5 micrometers.

During operation of device 50, the various pixels of device 50 are addressed according to an addressing scheme, as described above. Generally, the pixels are addressed one row at a time. Accordingly, the source terminals of a first row of pixels is supplied with the pixels' respective driving voltages. Control signals are then supplied to each of the gate terminals of the pixels' transistors, causing the pixel electrode of each pixel to be subjected to that pixel's respective driving voltage. After all pixels in the row of pixels have been addressed (i.e., their pixel electrodes have been set to their respective driving voltages), the addressing scheme moves on to the next row of pixels and the process repeats.

With respect to pixel 500a depicted in FIG. 5A, therefore, for the majority of the addressing period (i.e., the time required to address all pixels in device 50), source terminal 551b and gate terminal 554b of neighboring pixel 500b are set to minimum voltages. But, when pixel 500b to the right of pixel 500a is being addressed, both source terminal 551b and gate terminal 554b may be set to non-minimum voltages. Specifically, source terminal 551b may be set to the desired driving voltage for pixel 500b and the gate terminal 554b may be set to a control voltage configured to turn on transistor 550b enabling the pixel electrode of pixel 500b to be set to the desired driving voltage.

When pixel 500b is being addressed, the voltages of source terminal 551b and gate terminal 554b of transistor 550b can generate fringe electric fields. In the configuration of pixel 500a depicted in FIG. 5A, however, due to the proximity of the bottom electrode 556, those fringe electric fields are formed in combination with bottom electrode 556 rather than electrode 519. That is, the fringe electric field formed with electrode 519 is weaker than the fringe electric field formed with bottom electrode 556. This results because both bottom electrode 556 and electrode 519 may each be connected to common voltage nodes (not illustrated), enabling both electrode 556 and electrode 519 to be set to the same common voltage for device 50. In this case, the fringe field 590 is depicted by a dashed arrow in FIG. 5B. In this arrangement, fringe electric field 590 does not tend to exert a meaningful force against second fluid 512 of pixel 500a. This, then, can operate to at least partially prevent the promotion of movement of first fluid 511 away from the pixel wall 521a nearest fluid accumulation region 586 as may be found in conventional pixel configurations.

Figure 6:
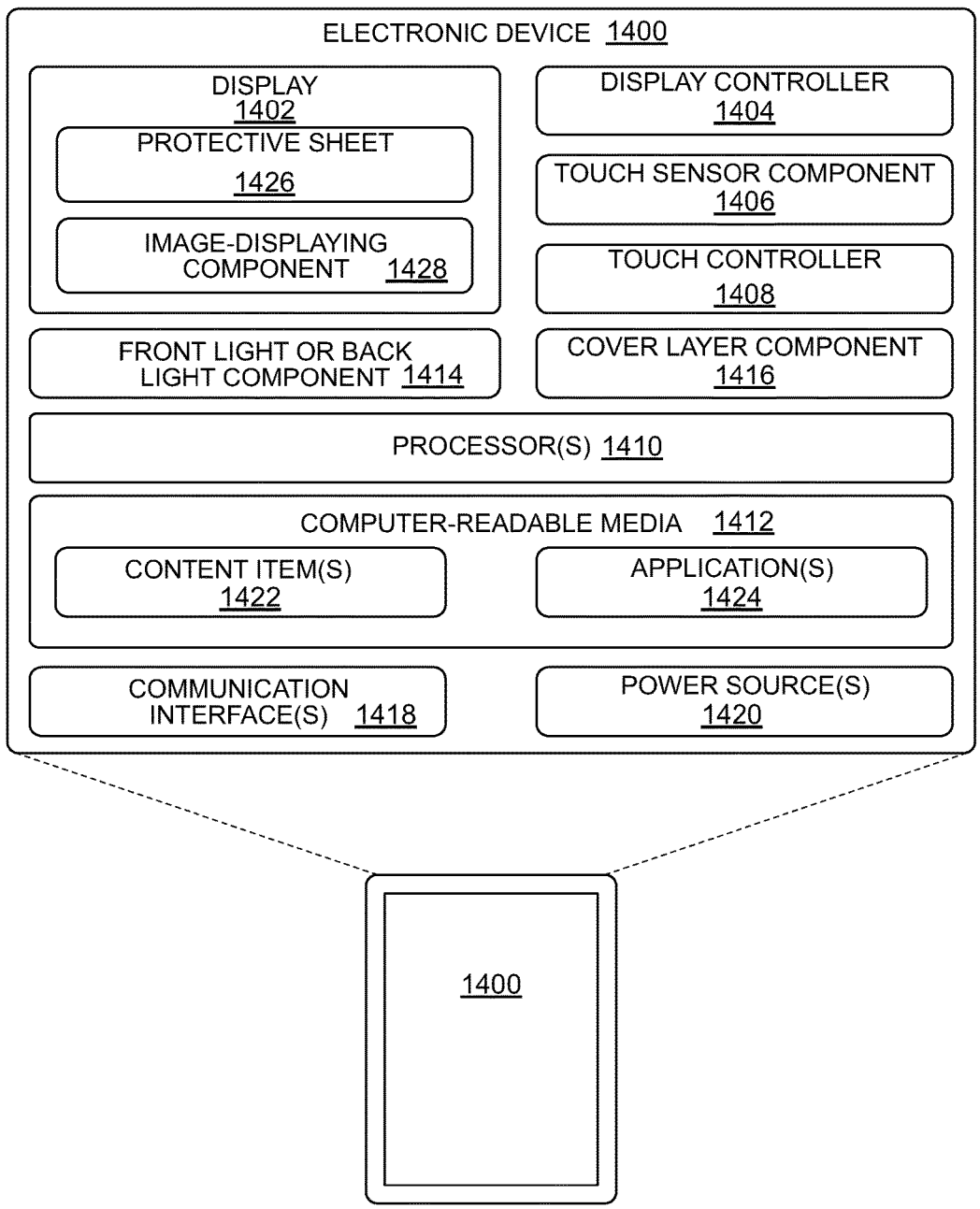
FIG. 6 illustrates an example electronic device that may incorporate a display device, according to various embodiments.

FIG. 6 illustrates an example electronic device 1400a that may incorporate any of the display devices discussed above. Electronic device 1400a may comprise any type of electronic device having a display. For instance, electronic device 1400a may be a mobile electronic device (e.g., an electronic book reader, a tablet computing device, a laptop computer, a smart phone or other multifunction communication device, a portable digital assistant, a wearable computing device, or an automotive display). Alternatively, electronic device 1400a may be a non-mobile electronic device (e.g., a computer display or a television). In addition, while FIG. 6 illustrates several example components of electronic device 1400, it is to be appreciated that electronic device 1400a may also include other conventional components, such as an operating system, system busses, input/output components, and the like. Further, in other embodiments, such as in the case of a television or computer monitor, electronic device 1400a may only include a subset of the components illustrated.

Regardless of the specific implementation of electronic device 1400, electronic device 1400a includes a display 1402 and a corresponding display controller 1404. The display 1402 may represent a reflective or transmissive display in some instances or, alternatively, a transflective display (partially transmissive and partially reflective).

In one embodiment, display 1402 comprises an electrowetting display that employs an applied voltage to change the surface tension of a fluid in relation to a surface. For example, such an electrowetting display may include an array of pixels as described herein, though claimed subject matter is not limited in this respect. By applying a voltage across a portion of an electrowetting pixel of an electrowetting display, wetting properties of a surface may be modified so that the surface becomes increasingly hydrophilic. As one example of an electrowetting display, the modification of the surface tension acts as an optical switch by displacing a colored oil film if a voltage is applied to individual pixels of the display. If the voltage is absent, the colored oil forms a continuous film within a pixel, and the color may thus be visible to a user. On the other hand, if the voltage is applied to the pixel, the colored oil is displaced and the pixel becomes transparent. If multiple pixels of the display are independently activated, display 1402 may present a color or grayscale image. The pixels may form the basis for a transmissive, reflective, or transmissive/reflective (transreflective) display. Further, the pixels may be responsive to high switching speeds (e.g., on the order of several milliseconds), while employing small pixel dimensions. Accordingly, the electrowetting displays herein may be suitable for applications such as displaying video or other animated content.

Of course, while several different examples have been given, it is to be appreciated that while some of the examples described above are discussed as rendering black, white, and varying shades of gray, it is to be appreciated that the described techniques apply equally to reflective displays capable of rendering color pixels. As such, the terms "white," "gray," and "black" may refer to varying degrees of color in implementations utilizing color displays. For instance, where a pixel includes a red color filter, a "gray" value of the pixel may correspond to a shade of pink while a "white" value of the pixel may correspond to a brightest red of the color filter. Furthermore, while some examples herein are described in the environment of a reflective display, in other examples, display 1402 may represent a backlit display, examples of which are mentioned above.

In addition to including display 1402, FIG. 6 illustrates that some examples of electronic device 1400a may include a touch sensor component 1406 and a touch controller 1408. In some instances, at least one touch sensor component 1406 resides with, or is stacked on, display 1402 to form a touch-sensitive display. Thus, display 1402 may be capable of both accepting user touch input and rendering content in response to or corresponding to the touch input. As several examples, touch sensor component 1406 may comprise a capacitive touch sensor, a force sensitive resistance (FSR), an interpolating force sensitive resistance (IFSR) sensor, or any other type of touch sensor. In some instances, touch sensor component 1406 is capable of detecting touches as well as determining an amount of pressure or force of these touches.

FIG. 6 further illustrates that electronic device 1400a may include one or more processors 1410 and one or more computer-readable media 1412, as well as a front light component 1414 (which may alternatively be a backlight component in the case of a backlit display) for lighting display 1402, a cover layer component 1416, such as a cover glass or cover sheet, one or more communication interfaces 1418 and one or more power sources 1420. The communication interfaces 1418 may support both wired and wireless connection to various networks, such as cellular networks, radio, WiFi networks, short range networks (e.g., Bluetooth® technology), and infrared (IR) networks, for example.

Depending on the configuration of electronic device 1400, computer-readable media 1412 (and other computer-readable media described throughout) is an example of computer storage media and may include volatile and nonvolatile memory. Thus, computer-readable media 1412 may include, without limitation, RAM, ROM, EEPROM, flash memory, and/or other memory technology, and/or any other suitable medium that may be used to store computer-readable instructions, programs, applications, media items, and/or data which may be accessed by electronic device 1400a.

Computer-readable media 1412 may be used to store any number of functional components that are executable on processor 1410, as well as content items 1422 and applications 1424. Thus, computer-readable media 1412 may include an operating system and a storage database to store one or more content items 1422, such as eBooks, audio books, songs, videos, still images, and the like. Computer-readable media 1412 of electronic device 1400a may also store one or more content presentation applications to render content items on electronic device 1400a. These content presentation applications may be implemented as various applications 1424 depending upon content items 1422. For instance, the content presentation application may be an electronic book reader application for rending textual electronic books, an audio player for playing audio books or songs, or a video player for playing video.

In some instances, electronic device 1400a may couple to a cover (not illustrated in FIG. 6) to protect the display 1402 (and other components in the display stack or display assembly) of electronic device 1400a. In one example, the cover may include a back flap that covers a back portion of electronic device 1400a and a front flap that covers display 1402 and the other components in the stack. Electronic device 1400a and/or the cover may include a sensor (e.g., a Hall effect sensor) to detect whether the cover is open (i.e., if the front flap is not atop display 1402 and other components). The sensor may send a signal to front light component 1414 if the cover is open and, in response, front light component 1414 may illuminate display 1402. If the cover is closed, meanwhile, front light component 1414 may receive a signal indicating that the cover has closed and, in response, front light component 1414 may turn off.

Furthermore, the amount of light emitted by front light component 1414 may vary. For instance, upon a user opening the cover, the light from the front light may gradually increase to its full illumination. In some instances, electronic device 1400*a* includes an ambient light sensor (not illustrated in FIG. 6) and the amount of illumination of front light component 1414 may be based at least in part on the amount of ambient light detected by the ambient light sensor. For example, front light component 1414 may be dimmer if the ambient light sensor detects relatively little ambient light, such as in a dark room; may be brighter if the ambient light sensor detects ambient light within a particular range; and may be dimmer or turned off if the ambient light sensor detects a relatively large amount of ambient light, such as direct sunlight.

In addition, the settings of display 1402 may vary depending on whether front light component 1414 is on or off, or based on the amount of light provided by front light component 1414. For instance, electronic device 1400*a* may implement a larger default font or a greater contrast when the light is off compared to when the light is on. In some embodiments, electronic device 1400*a* maintains, if the light is on, a contrast ratio for display 1402 that is within a certain defined percentage of the contrast ratio if the light is off.

As described above, touch sensor component 1406 may comprise a capacitive touch sensor that resides atop display 1402. In some examples, touch sensor component 1406 may be formed on or integrated with cover layer component 1416. In other examples, touch sensor component 1406 may be a separate component in the stack of the display assembly. Front light component 1414 may reside atop or below touch sensor component 1406. In some instances, either touch sensor component 1406 or front light component 1414 is coupled to a top surface of a protective sheet 1426 of display 1402. As one example, front light component 1414 may include a lightguide sheet and a light source (not illustrated in FIG. 6). The lightguide sheet may comprise a substrate (e.g., a transparent thermoplastic such as PMMA or other acrylic), a layer of lacquer and multiple grating elements formed in the layer of lacquer that function to propagate light from the light source towards display 1402; thus, illuminating display 1402.

Cover layer component 1416 may include a transparent substrate or sheet having an outer layer that functions to reduce at least one of glare or reflection of ambient light incident on electronic device 1400*a*. In some instances, cover layer component 1416 may comprise a hard-coated polyester and/or polycarbonate film, including a base polyester or a polycarbonate, that results in a chemically bonded UV-cured hard surface coating that is scratch resistant. In some instances, the film may be manufactured with additives such that the resulting film includes a hardness rating that is greater than a predefined threshold (e.g., at least a hardness rating that is resistant to a 3*h* pencil). Without such scratch resistance, a device may be more easily scratched and a user may perceive the scratches from the light that is dispersed over the top of the reflective display. In some examples, protective sheet 1426 may include a similar UV-cured hard coating on the outer surface. Cover layer component 1416 may couple to another component or to protective sheet 1426 of display 1402. Cover layer component 1416 may, in some instances, also include a UV filter, a UV-absorbing dye, or the like, for protecting components lower in the stack from UV light incident on electronic device 1400*a*. In still other examples, cover layer component 1416 may include a sheet of high-strength glass having an antiglare and/or antireflective coating.

Display 1402 includes protective sheet 1426 overlying an image-displaying component 1428. For example, display 1402 may be preassembled to have protective sheet 1426 as an outer surface on the upper or image-viewing side of display 1402. Accordingly, protective sheet 1426 may be integral with and may overlay image-displaying component 1428. Protective sheet 1426 may be optically transparent to enable a user to view, through protective sheet 1426, an image presented on image-displaying component 1428 of display 1402.

In some examples, protective sheet 1426 may be a transparent polymer film in the range of 25 to 200 micrometers in thickness. As several examples, protective sheet 1426 may be a transparent polyester, such as polyethylene terephthalate (PET) or polyethylene naphthalate (PEN), or other suitable transparent polymer film or sheet, such as a polycarbonate or an acrylic. In some examples, the outer surface of protective sheet 1426 may include a coating, such as the hard coating described above. For instance, the hard coating may be applied to the outer surface of protective sheet 1426 before or after assembly of protective sheet 1426 with image-displaying component 1428 of display 1402. In some examples, the hard coating may include a photoinitiator or other reactive species in its composition, such as for curing the hard coating on protective sheet 1426. Furthermore, in some examples, protective sheet 1426 may be dyed with a UV-light-absorbing dye, or may be treated with other UV-absorbing treatment. For example, protective sheet 1426 may be treated to have a specified UV cutoff such that UV light below a cutoff or threshold wavelength is at least partially absorbed by protective sheet 1426, thereby protecting image-displaying component 1428 from UV light.

According to some embodiments herein, one or more of the components discussed above may be coupled to display 1402 using fluid optically-clear adhesive (LOCA). For example, the lightguide portion of front light component 1414 may be coupled to display 1402 by placing LOCA on the outer or upper surface of protective sheet 1426. If the LOCA reaches the corner(s) and/or at least a portion of the perimeter of protective sheet 1426, UV-curing may be performed on the LOCA at the corners and/or the portion of the perimeter. Thereafter, the remaining LOCA may be UV-cured and front light component 1414 may be coupled to the LOCA. By first curing the corner(s) and/or the perimeter, the techniques effectively create a barrier for the remaining LOCA and also prevent the formation of air gaps in the LOCA layer, thereby increasing the efficacy of front light component 1414. In other embodiments, the LOCA may be placed near a center of protective sheet 1426, and pressed outwards towards a perimeter of the top surface of protective sheet 1426 by placing front light component 1414 on top of the LOCA. The LOCA may then be cured by directing UV light through front light component 1414. As discussed above, and as discussed additionally below, various techniques, such as surface treatment of the protective sheet, may be used to prevent discoloration of the LOCA and/or protective sheet 1426.

While FIG. 6 illustrates a few example components, electronic device 1400*a* may have additional features or functionality. For example, electronic device 1400*a* may also include additional data storage devices (removable and/or non-removable) such as, for example, magnetic disks, optical disks, or tape. The additional data storage media, which may reside in a control board, may include volatile and nonvolatile, removable and non-removable media implemented in any method or technology for storage of information, such as computer readable instructions, data structures, program modules, or other data. In addition, some or all of the functionality described as residing within electronic device 1400a may reside remotely from electronic device 1400a in some implementations. In these implementations, electronic device 1400a may utilize communication interfaces 1418 to communicate with and utilize this functionality.

In an embodiment, an electrowetting display device includes a first support plate and a second support plate opposite the first support plate. The device includes a plurality of pixel walls over the first support plate. The plurality of pixel walls are associated with an electrowetting pixel and define a volume containing at least a portion of an oil and an electrolyte fluid. The electrowetting pixel includes a fluid accumulation region including a recessed region in a hydrophobic layer of the electrowetting pixel. The device includes a transistor over the first support plate underneath a first pixel wall in the plurality of pixel walls. The transistor includes a source terminal, a drain terminal, and a semiconducting channel in contact with the source terminal and the drain terminal. The semiconducting channel includes a doped semiconducting material. The device includes a pixel electrode over the first support plate underneath the volume defined by the plurality of pixel walls. The pixel electrode is electrically connected to the drain terminal of the transistor. The pixel electrode is not underneath the fluid accumulation region of the electrowetting pixel. The device includes a bottom electrode over the first support plate underneath the volume defined by the plurality of pixel walls. The bottom electrode is connected to a common voltage node and at least a first portion of the bottom electrode is underneath the pixel electrode and a second portion of the bottom electrode is underneath the fluid accumulation region of the electrowetting pixel.

In another embodiment, a device includes a first support plate and a second support plate opposite the first support plate, and a plurality of pixel walls over the first support plate. The plurality of pixel walls are associated with an electrowetting pixel and define a volume containing at least a portion of an oil and an electrolyte fluid. The electrowetting pixel includes a fluid accumulation region defined by a recess in a hydrophobic layer of the electrowetting pixel. The device includes a transistor over the first support plate underneath a first pixel wall in the plurality of pixel walls and a pixel electrode over the first support plate and underneath the volume defined by the plurality of pixel walls. The pixel electrode is electrically connected to the transistor. The device includes a bottom electrode over the first support plate and underneath the volume defined by the plurality of pixel walls. A first portion of the bottom electrode is located underneath the fluid accumulation region and a second portion of the bottom electrode is located underneath the pixel electrode.

In an embodiment, a device includes a first support plate and a second support plate opposite the first support plate and a plurality of pixel walls over the first support plate. The plurality of pixel walls are associated with an electrowetting pixel and define a volume containing at least a portion of an oil and an electrolyte fluid. The device includes a transistor over the first support plate. At least a portion of the transistor is underneath a first pixel wall in the plurality of pixel walls. The device includes a pixel electrode over the first support plate underneath the volume defined by the plurality of pixel walls. The pixel electrode is electrically connected to the transistor. The device includes a second transistor underneath a second pixel wall in the plurality of pixel walls, a common electrode on the second support plate, and a bottom electrode over the first support plate underneath the volume defined by the plurality of pixel walls. A fringe electric field formed between the common electrode and a terminal of the second transistor is weaker than a fringe electric field formed between the bottom electrode and the terminal of the transistor when a control voltage is applied to the terminal of the second transistor.

Although the subject matter has been described in language specific to structural features and/or methodological acts, it is to be understood that the subject matter defined in the appended claims is not necessarily limited to the specific features or acts described. Rather, the specific features and acts are disclosed as illustrative forms of implementing the claims.

One skilled in the art will realize that a virtually unlimited number of variations to the above descriptions are possible, and that the examples and the accompanying figures are merely to illustrate one or more examples of implementations.

It will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

In the detailed description above, numerous specific details are set forth to provide a thorough understanding of claimed subject matter. However, it will be understood by those skilled in the art that claimed subject matter may be practiced without these specific details. In other instances, methods, apparatuses, or systems that would be known by one of ordinary skill have not been described in detail so as not to obscure claimed subject matter.

Reference throughout this specification to "one embodiment" or "an embodiment" may mean that a particular feature, structure, or characteristic described in connection with a particular embodiment may be included in at least one embodiment of claimed subject matter. Thus, appearances of the phrase "in one embodiment" or "an embodiment" in various places throughout this specification is not necessarily intended to refer to the same embodiment or to any one particular embodiment described. Furthermore, it is to be understood that particular features, structures, or characteristics described may be combined in various ways in one or more embodiments. In general, of course, these and other issues may vary with the particular context of usage. Therefore, the particular context of the description or the usage of these terms may provide helpful guidance regarding inferences to be drawn for that context.

What is claimed is:

1. An electrowetting display device, comprising:
   a first support plate and a second support plate opposite the first support plate;
   a plurality of pixel walls over the first support plate, the plurality of pixel walls being associated with an electrowetting pixel and defining a volume containing at least a portion of an oil and an electrolyte fluid, the electrowetting pixel including a fluid accumulation region including a recessed region in a hydrophobic layer of the electrowetting pixel;
a transistor over the first support plate underneath a first pixel wall in the plurality of pixel walls, the transistor including:
a source terminal,
a drain terminal, and
a semiconducting channel in contact with the source terminal and the drain terminal, the semiconducting channel including a doped semiconducting material;
a pixel electrode over the first support plate underneath the volume defined by the plurality of pixel walls, the pixel electrode being electrically connected to the drain terminal of the transistor, wherein the pixel electrode is not underneath the fluid accumulation region of the electrowetting pixel; and
a bottom electrode over the first support plate underneath the volume defined by the plurality of pixel walls, the bottom electrode being connected to a common voltage node and wherein at least a first portion of the bottom electrode is underneath the pixel electrode and a second portion of the bottom electrode is underneath the fluid accumulation region of the electrowetting pixel.

2. The electrowetting display device of claim 1, further comprising:
a common electrode on the second support plate;
a second electrowetting pixel adjacent to the electrowetting pixel, the second electrowetting pixel including a second pixel electrode; and
a second transistor underneath a second pixel wall in the plurality of pixel walls, the second pixel wall being opposite the first pixel wall of the electrowetting pixel, the second transistor being connected to the second pixel electrode and wherein a fringe electric field formed between the common electrode and a terminal of the second transistor is weaker than a fringe electric field formed between the bottom electrode and the terminal of the second transistor when a control voltage is applied to the terminal of the second transistor.

3. The electrowetting display device of claim 2, further comprising a second common voltage node connected to the common electrode and wherein the common voltage node and the second common voltage node are at the same electric potential to promote formation of the fringe electric field between the common electrode and the terminal of the second transistor when a control voltage is applied to the terminal of the second transistor.

4. The electrowetting display device of claim 1, further comprising:
a common electrode on the second support plate;
a second electrowetting pixel adjacent to the electrowetting pixel, the second electrowetting pixel including a second pixel electrode; and
a second transistor underneath a second pixel wall in the plurality of pixel walls, the second pixel wall being opposite the first pixel wall of the electrowetting pixel, the second transistor being connected to the second pixel electrode and wherein a minimum distance between the bottom electrode and a terminal of the second transistor is less than a minimum distance between the common electrode and the terminal of the second transistor.

5. A device, comprising:
a first support plate and a second support plate opposite the first support plate;
a plurality of pixel walls over the first support plate, the plurality of pixel walls being associated with an electrowetting pixel and defining a volume containing at least a portion of an oil and an electrolyte fluid, the electrowetting pixel including a fluid accumulation region defined by a recess in a hydrophobic layer of the electrowetting pixel;
a transistor over the first support plate underneath a first pixel wall in the plurality of pixel walls;
a pixel electrode over the first support plate and underneath the volume defined by the plurality of pixel walls, the pixel electrode being electrically connected to the transistor; and
a bottom electrode over the first support plate and underneath the volume defined by the plurality of pixel walls, wherein a first portion of the bottom electrode is located underneath the fluid accumulation region and a second portion of the bottom electrode is located underneath the pixel electrode.

6. The device claim 5, further comprising:
a common electrode on the second support plate;
a second electrowetting pixel adjacent to the electrowetting pixel, the second electrowetting pixel including a second pixel electrode; and
a second transistor underneath a second pixel wall in the plurality of pixel walls, the second transistor being connected to the second pixel electrode and wherein a fringe electric field formed between the common electrode and a terminal of the second transistor is weaker than a fringe electric field formed between the bottom electrode and the terminal of the transistor when a control voltage is applied to the terminal of the second transistor.

7. The device of claim 5, further comprising:
a common electrode on the second support plate;
a second electrowetting pixel adjacent to the electrowetting pixel, the second electrowetting pixel including a second pixel electrode; and
a second transistor underneath a second pixel wall in the plurality of pixel walls, the second transistor being connected to the second pixel electrode and wherein a minimum distance between the bottom electrode and a terminal of the second transistor is less than a minimum distance between the common electrode and the terminal of the second transistor.

8. The device of claim 5, further comprising a common electrode on the second support plate, wherein the bottom electrode is connected to a common voltage node and the common electrode is connected to a second common voltage node and the common voltage node and the second common voltage node are at the same electric potential.

9. The device of claim 5, further comprising:
a second electrowetting pixel adjacent to the electrowetting pixel, the second electrowetting pixel including a second pixel electrode; and
a second transistor underneath a second pixel wall in the plurality of pixel walls, the second transistor being connected to the second pixel electrode and wherein a minimum distance between the pixel electrode and the second transistor is greater than a minimum distance between the bottom electrode and the second transistor.

10. The device of claim 5, wherein the pixel electrode is not located underneath the fluid accumulation region.

11. The device of claim 5, further comprising a black matrix material on the second support plate, wherein the black matrix material is over the fluid accumulation region of the electrowetting pixel.

12. The device of claim 5, further comprising a layer of silicon nitride formed between the transistor and the first pixel wall.

13. A device, comprising:
- a first support plate and a second support plate opposite the first support plate;
- a plurality of pixel walls over the first support plate, the plurality of pixel walls being associated with an electrowetting pixel and defining a volume containing at least a portion of an oil and an electrolyte fluid;
- a transistor over the first support plate, at least a portion of the transistor being underneath a first pixel wall in the plurality of pixel walls;
- a pixel electrode over the first support plate underneath the volume defined by the plurality of pixel walls, the pixel electrode being electrically connected to the transistor;
- a second transistor underneath a second pixel wall in the plurality of pixel walls;
- a common electrode on the second support plate; and
- a bottom electrode over the first support plate underneath the volume defined by the plurality of pixel walls, wherein a fringe electric field formed between the common electrode and a terminal of the second transistor is weaker than a fringe electric field formed between the bottom electrode and the terminal of the transistor when a control voltage is applied to the terminal of the second transistor.

14. The device of claim 13, wherein a minimum distance between the bottom electrode and the terminal of the second transistor is less than a minimum distance between the common electrode and the terminal of the second transistor.

15. The device of claim 13, wherein the bottom electrode is connected to a common voltage node and the common electrode is connected to a second common voltage node and the common voltage node and the second common voltage node are at the same electric potential.

16. The device of claim 13, wherein a minimum distance between the pixel electrode and the second transistor is greater than a minimum distance between the bottom electrode and the second transistor.

17. The device of claim 13, further comprising a fluid accumulation region defined by a recess in a hydrophobic layer of the electrowetting pixel.

18. The device of claim 17, wherein the pixel electrode is not underneath the fluid accumulation region and at least a portion of the bottom electrode is underneath the fluid accumulation region.

19. The device of claim 17, further comprising a black matrix material on the second support plate, wherein the black matrix material is over the fluid accumulation region of the electrowetting pixel.

20. The device of claim 13, further comprising a layer of silicon nitride formed between the transistor and the first pixel wall.

* * * * *